(12) United States Patent
Lan et al.

(10) Patent No.: US 11,393,789 B2
(45) Date of Patent: Jul. 19, 2022

(54) STACKED CIRCUITS OF III-V DEVICES OVER SILICON WITH HIGH QUALITY INTEGRATED PASSIVES WITH HYBRID BONDING

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 210 days.

(21) Appl. No.: 16/600,300

(22) Filed: Oct. 11, 2019

(65) Prior Publication Data

US 2020/0381398 A1    Dec. 3, 2020

Related U.S. Application Data

(60) Provisional application No. 62/855,692, filed on May 31, 2019.

(51) Int. Cl.
*H01L 23/00* (2006.01)
*H01L 25/065* (2006.01)
(Continued)

(52) U.S. Cl.
CPC ........ *H01L 25/0657* (2013.01); *H01L 23/481* (2013.01); *H01L 24/08* (2013.01); *H01L 24/17* (2013.01); *H01L 24/80* (2013.01); *H01L 25/18* (2013.01); *H01L 25/50* (2013.01); *H01L 2224/08145* (2013.01); *H01L 2224/14519* (2013.01); *H01L 2224/80895* (2013.01); *H01L 2224/80896* (2013.01); *H01L 2225/06524* (2013.01); *H01L 2225/06544* (2013.01);
(Continued)

(58) Field of Classification Search
CPC ..... H01L 25/0657; H01L 25/18; H01L 25/50; H01L 23/481; H01L 24/08; H01L 24/17; H01L 24/80; H01L 2224/08145; H01L 2224/14519; H01L 2224/80895; H01L 2224/80896; H01L 2225/06524; H01L 2225/06544; H01L 2225/06589; H01L 2924/10253; H01L 2924/10329; H01L 2924/13064; H01L 2924/13091; H01L 2924/19041; H01L 2924/19042; H01L 2924/19104
USPC ....................................... 257/777
See application file for complete search history.

(56) References Cited

U.S. PATENT DOCUMENTS 7,875,952 B1 * 1/2011 Elliott ............... H01L 24/83
257/499
10,134,945 B1 * 11/2018 Liu .................. H01L 21/8258
(Continued)

*Primary Examiner* — David Vu
*Assistant Examiner* — Brandon C Fox
(74) *Attorney, Agent, or Firm* — Muncy, Geissler, Olds & Lowe, P.C./Qualcomm

(57) ABSTRACT

3D integrated circuit (3DIC) device architecture is disclosed for monolithically heterogeneous integration of III-V devices over Si-CMOS devices with high-quality (HQ) integrated passives devices (IPD) or re-distributed layers (RDL). In addition, a thermal spreader may be added over the upper III-V tier to enhance device power performance (e.g., PAE for PA) and device reliability (e.g., with a reduced Tj/junction temperature).

30 Claims, 22 Drawing Sheets

(51) Int. Cl.
*H01L 23/48* (2006.01)
*H01L 25/00* (2006.01)
*H01L 25/18* (2006.01)

(52) U.S. Cl.
CPC ............... *H01L 2225/06589* (2013.01); *H01L 2924/10253* (2013.01); *H01L 2924/10329* (2013.01); *H01L 2924/13064* (2013.01); *H01L 2924/13091* (2013.01); *H01L 2924/19041* (2013.01); *H01L 2924/19042* (2013.01); *H01L 2924/19104* (2013.01)

(56) References Cited

U.S. PATENT DOCUMENTS

| | | | |
|---|---|---|---|
| 10,510,415 B1* | 12/2019 | Huo | H01L 27/11582 |
| 2006/0113545 A1* | 6/2006 | Weber | H01L 21/02502 |
| | | | 257/77 |
| 2009/0297091 A1* | 12/2009 | Assefa | H01L 27/0688 |
| | | | 257/351 |
| 2010/0219509 A1* | 9/2010 | He | H01L 31/1844 |
| | | | 257/618 |
| 2012/0228672 A1* | 9/2012 | Daval | H01L 29/78684 |
| | | | 257/192 |
| 2018/0012868 A1* | 1/2018 | Huang | H01L 24/94 |
| 2019/0148342 A1* | 5/2019 | Hu | H01L 23/5385 |
| | | | 257/659 |

* cited by examiner

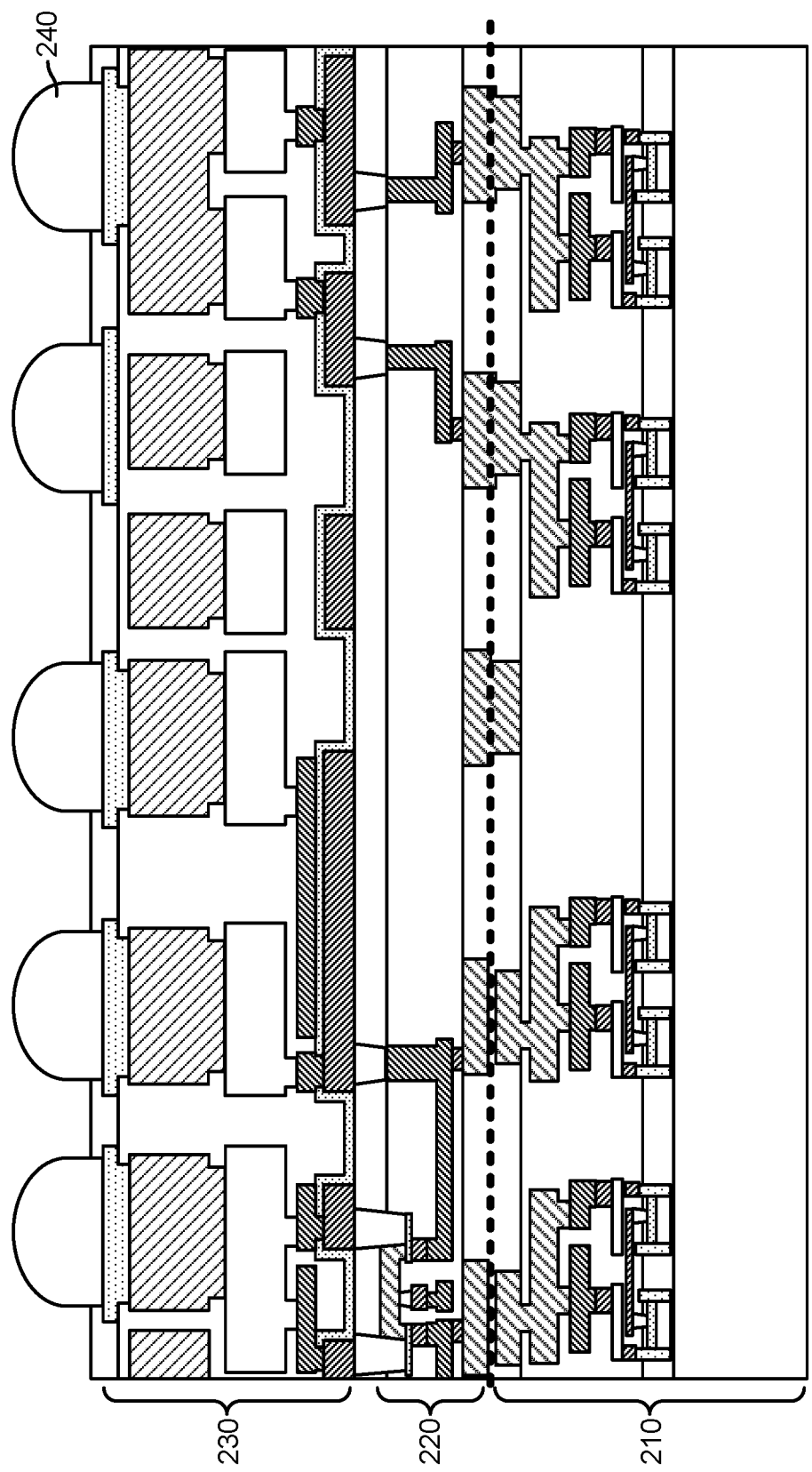

STACKED CIRCUITS OF III-V DEVICES OVER SILICON WITH HIGH QUALITY INTEGRATED PASSIVES WITH HYBRID BONDING

CROSS-REFERENCE TO RELATED APPLICATION

The present Application for Patent claims the benefit of U.S. Provisional Patent Application No. 62/855,692 entitled "STACKED CIRCUITS OF III-V DEVICES OVER SILICON WITH HIGH QUALITY INTEGRATED PASSIVES WITH HYBRID BONDING," filed May 31, 2019, assigned to the assignee hereof, and expressly incorporated herein by reference in its entirety.

FIELD OF DISCLOSURE

In at least one aspect, the field of the disclosed subject matter relates to stacked circuits of III-V devices over silicon (Si) devices with high quality (HQ) integrated passive devices (IPD) with hybrid bonding (HB) and to methods of manufacturing the same.

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., Long Term Evolution (LTE) or WiMax). There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Time Division Multiple Access (TDMA), the Global System for Mobile access (GSM) variation of TDMA, etc.

In the current fifth-generation (5G) and coming sixth-generation (6G) era, massive wireless communication capability will be in demand. Applications such as autonomous drive, industry internet-of-things (IOT), infotainment, gaming, education, interactive-collaborations with artificial intelligence (AI), and virtual reality (VR), augmented reality (AR), and so on may require substantial speeds in both uplink and downlink, e.g., higher than 10 Gbps. Such speeds may be realized with millimeter wave (mmWave) communications that can offer wider bandwidth.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary stacked circuit is disclosed. The stacked circuit may comprise a first tier and a second tier on the first tier. The first tier may comprise one or more first technology devices and one or more first interconnects. At least one first interconnect may be electrically coupled to at least one first technology device. The second tier may comprise one or more second technology devices and one or more second interconnects. A technology of the second technology devices may be different from a technology of the first technology devices. At least one second interconnect may be electrically coupled to at least one second technology device. An upper surface of the first tier and a lower surface of the second tier may be hybrid bonded to each other. When hybrid bonded, one or more portions of a first insulator exposed at the upper surface of the first tier may be bonded to corresponding one or more portions of a second insulator exposed at the lower surface of the second tier. Also when hybrid bonded, the one or more first interconnects exposed at the upper surface of the first tier may be bonded to the one or more second interconnects exposed at the lower surface of the second tier such that the one or more first interconnects are electrically coupled to the one or more second interconnects.

An exemplary method of fabricating a stacked circuit is disclosed. The method may comprise forming a first tier and forming a second tier. The first tier may comprise one or more first technology devices and one or more first interconnects. At least one first interconnect may be electrically coupled to at least one first technology device. The second tier may comprise one or more second technology devices and one or more second interconnects. A technology of the second technology devices may be different from a technology of the first technology devices. At least one second interconnect may be electrically coupled to at least one second technology device. The method may also comprise hybrid bonding the first tier with the second tier. When hybrid bonded, one or more portions of a first insulator exposed at the upper surface of the first tier may be bonded to corresponding one or more portions of a second insulator exposed at the lower surface of the second tier. Also when hybrid bonded, the one or more first interconnects exposed at the upper surface of the first tier may be bonded to the one or more second interconnects exposed at the lower surface of the second tier such that the one or more first interconnects are electrically coupled to the one or more second interconnects.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIGS. 3 4A-4C, 5A-5B, 6, 7, 8A-8B, 9A-9B, & 10A-10B illustrate examples of different stages of fabricating a 3D stacked circuit according to one or more aspects

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

Figure 1A:
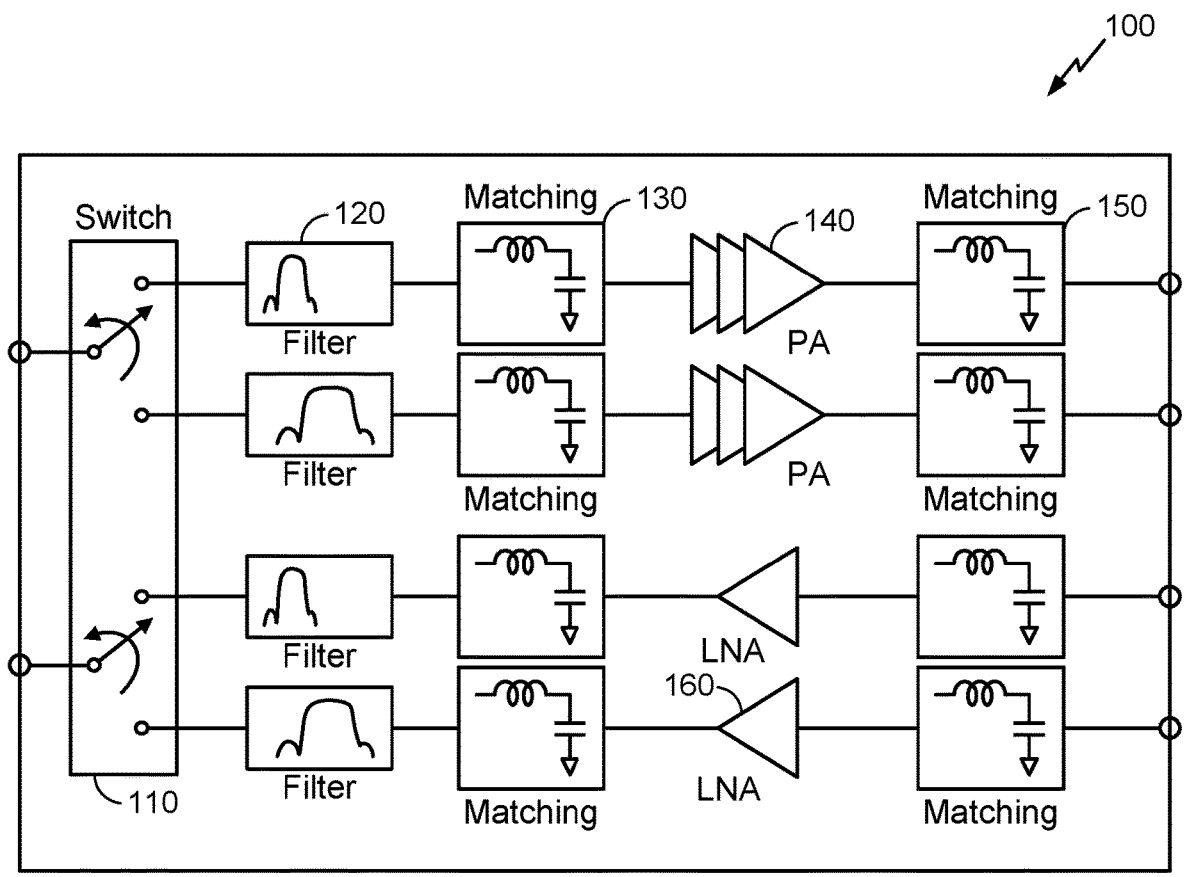
FIG. 1A illustrates a block diagram of a conventional low noise amplifier, power amplifier, filter.

As indicated above, extreme high speed data rates (e.g., in excess of 10 giga-bits per second (Gbps)) may be realized with millimeter wave (mmWave) communications that can offer wider bandwidth. FIG. 1A illustrates a block diagram of a conventional low noise amplifier (LNA), power amplifier (PA), filter (LPAF) 100. The LPAF 100 may be a wireless transceiver with upper half of FIG. 1A illustrating the transmitting portion and the lower half of FIG. 1A illustrating the receiving portion. The illustrated LPAF 100 includes a switch 110, radio frequency (RF) filters 120, first matching circuits 130, power amplifiers (PA) 140, second matching circuits 150, and LNAs 160.

Figure 1B:
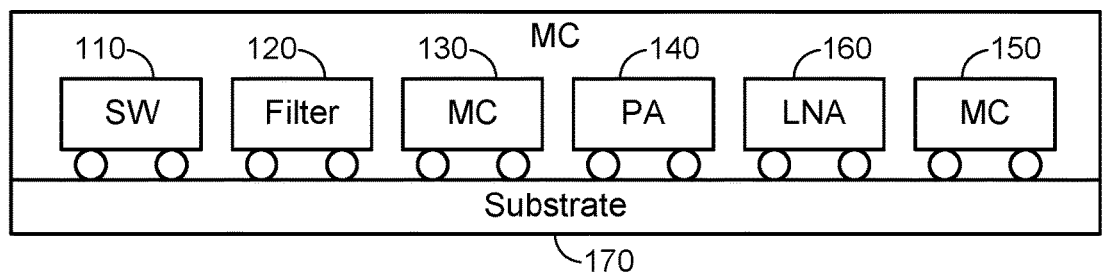
FIG. 1B illustrates a lay out of a conventional low noise amplifier, power amplifier, filter.

Conventionally, each of the components of the LPAF 100—the switch 110, the RF filters 120, the first and second matching circuits 130 and 150, the PAs 140, and the LNAs 160—are fabricated as individual devices or dies and assembled and interconnected on a substrate 170 as seen in FIG. 1B. Unfortunately, this can result in the assembled LPAF 100 being physically large. Also, due to components being individually fabricated, it can also be expensive. Further, damage can occur during assembly. In addition, signal losses can be more pronounced due to the relative long interconnection distances between the discrete components.

To address some or all of the issues associated with conventional packages such as the conventional LPAF 100, a novel 3D integrated circuit (3DIC) architecture is disclosed. A 3DIC stacked circuit of the proposed architecture may include devices, dies, and/or components of different technological processes. For example, a proposed 3DIC may include monolithically heterogeneous integration of III-V devices over silicon (Si) devices with high quality (HQ) integrated passive devices (IPD) with hybrid bonding (HB). Table 1 illustrates examples of components of an example LPAF and their respective technologies.

TABLE 1

| Device | Switch | Filter | Matching | PA | LNA | Matching |
|---|---|---|---|---|---|---|
| Process | CMOS | IPD | IPD | III-V | CMOS | IPD |

Figure 2A:
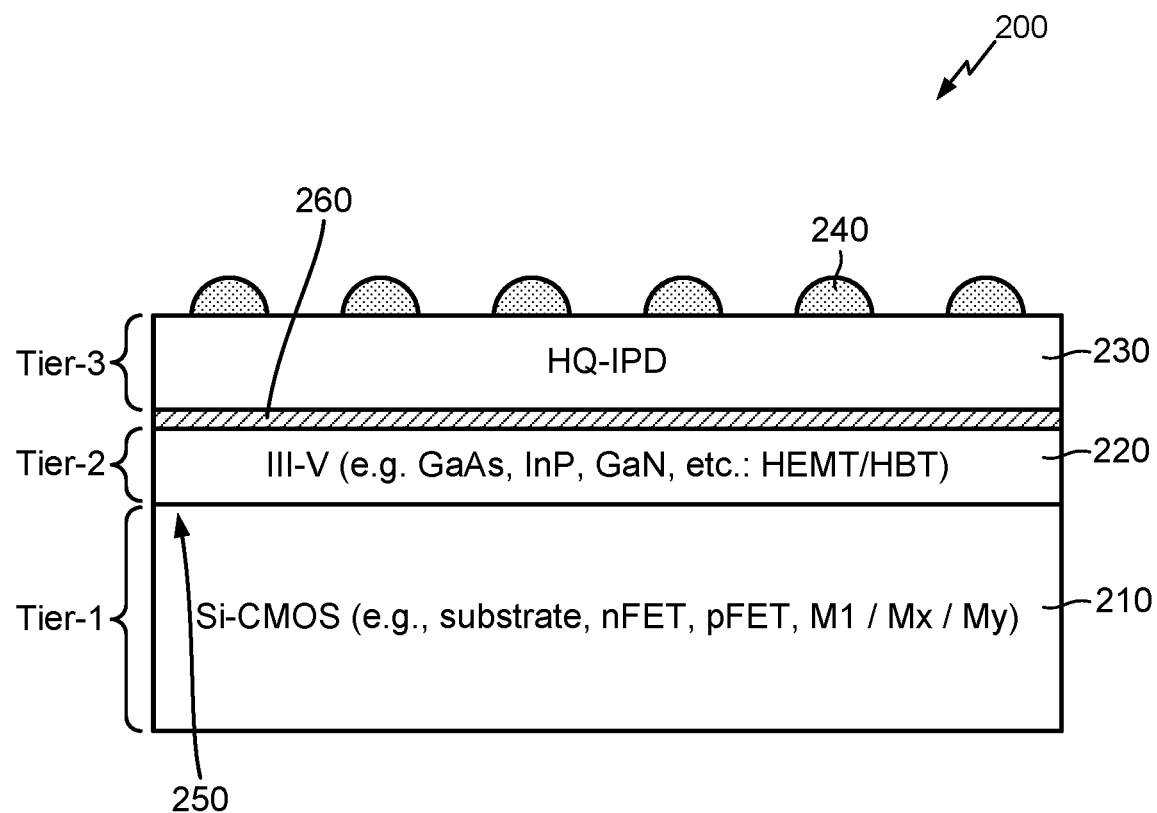
FIG. 2A illustrates a simplified view of a 3D stacked circuit/device architecture according to one or more aspects.

FIG. 2A illustrates a simplified view of an example 3D integrated circuit (3DIC) 200 according to one or more aspects. The 3DIC 200 may include a first tier 210, a second tier 220 on the first tier 210, a third tier 230, and bumps 240 stacked on each other. Hence, the 3DIC may also be referred to as a stacked circuit. Optionally, a thermal spreader 260 may be formed in between the second and third tiers 220, 230. Generally, the first tier 210 may include one or more devices of a first technology (first technology devices 214 shown in FIG. 2B), the second tier 220 may include one or more devices of a second technology (second technology devices 224 shown in FIG. 2B), and the third tier 230 may include IPDs 234 shown in FIG. 2B. The first and second technologies may be different from each other. In an aspect, the first technology devices 214 may be Si-based devices such as CMOS device, the second technology devices 224 may be group III-V based devices, and examples of IPDs 234 include resistors, capacitors, inductors, and so on.

In FIG. 2A, element 250 refers to hybrid bonding of the first and second tiers 210, 220 to each other. Two tiers may be hybrid bonded when at their interfaces, multiple disparate materials of the two tiers are bonded to each other (e.g., insulator-insulator bonding and conductor-conductor bonding). In this particular instance, upper surface of the first tier 210 may be hybrid bonded with lower surface of the second tier 220. Hybrid bonding will be detailed further below.

Before proceeding further, it should be noted that terms such as "on", "above", "below", "upper", "lower", "top", "bottom", "left", "right" and so on may be used. Unless indicated otherwise, these are merely terms of convenience, and should not be taken to be limiting. For example, they should not be taken to indicate absolute orientations.

Figure 2B:
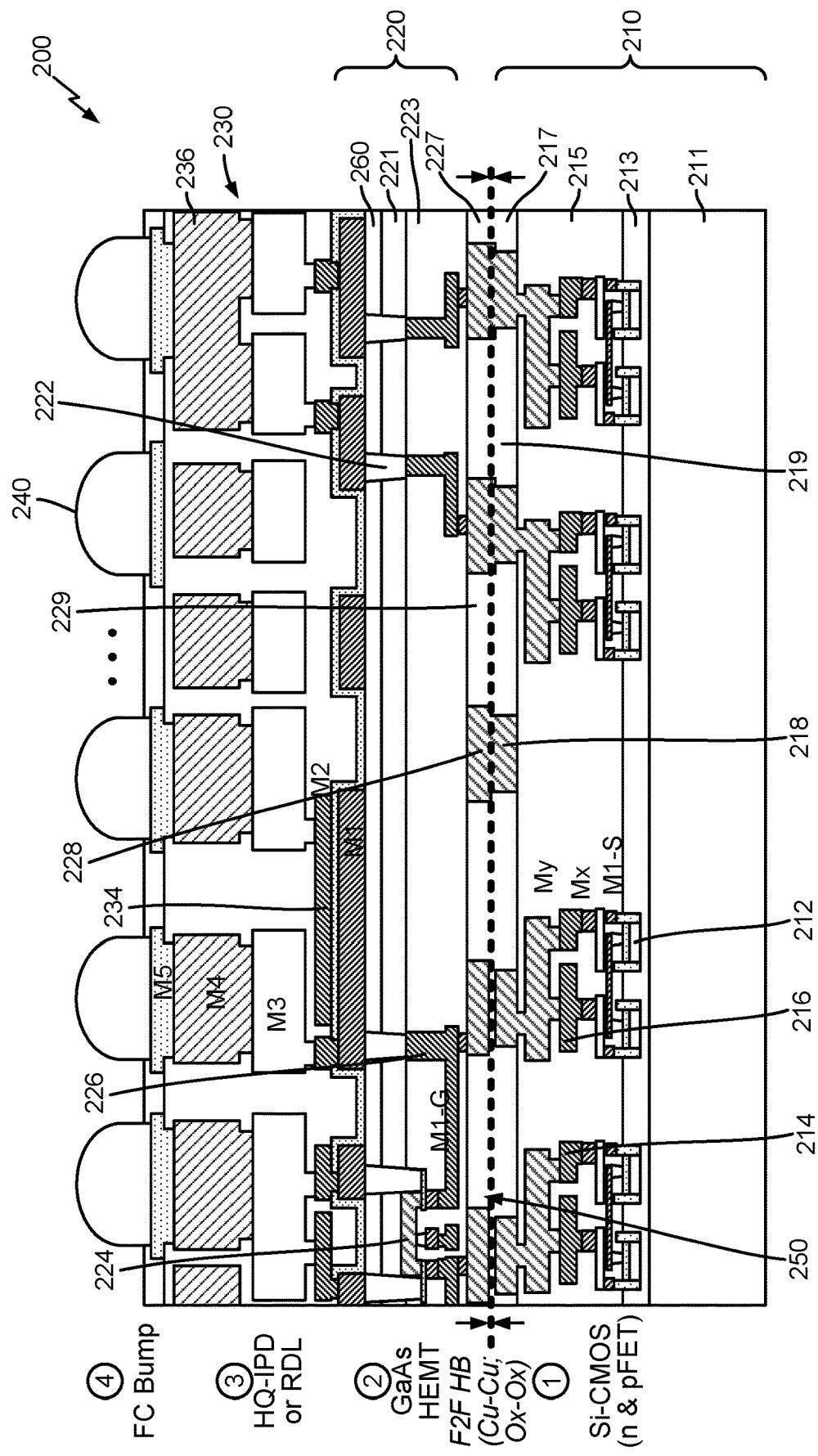
FIG. 2B illustrates a more detailed view of a 3D stacked circuit/device architecture according to one or more aspects.

FIG. 2B illustrates a more detailed view of the stacked circuit 200 according to one or more aspects. As seen, the first tier 210 may include, from bottom to top, a first substrate 211, a first device layer 213, a first routing layer 215, and a first interface layer 217. The first substrate 211 may a bulk-Si, a HR-Si, a SOI, and so on.

The first device layer 213 may be a layer that includes the first technology devices 214 isolated from each other through isolation insulator such as shallow trench isolation (STI) oxide. The first technology devices 214 may be Si-based devices such as switches, LNAs, transceivers, baseband controllers, and so on.

The first routing layer 215 may be a layer that includes one or more first signal routers 216 configured to route signals from/to the first technology devices 214. For example, the first routing layer 215 may be a redistribution layer (RDL). The first signal routers 216 may be formed from one or more metallizations (e.g., metallizations M1-S, Mx, My illustrated in FIG. 2B). One or more first signal routers 216 may be electrically coupled to one or more first technology devices 214, i.e., at least one first technology device 214 may be electrically coupled to at least one first signal router 216. As illustrated in the particular instance illustrated in FIG. 2B, the first technology devices 214 may be connected directly to the first signal routers 216.

The first interface layer 217 may be the hybrid bonding layer of the first tier 210. The first interface layer 217 may include one or more first interconnects 218 isolated from each other by a first insulator 219. The first insulator 219 may be an oxide such as silicon oxide. The first interconnects 218 may be electrically conductive. For example, the first interconnects 218 may be formed from metal such as copper (Cu).

One or more first interconnects 218 may be electrically coupled to one or more first technology devices 214, e.g., through one or more first signal routers 216. In other words, at least one first interconnect 218 may be electrically coupled to at least one first technology device 214. As illustrated in the particular instance illustrated in FIG. 2B, the first interconnects 218 may also be connected to the first signal routers 216.

The upper surface of the first interface layer 217 may be the upper surface of the first tier 210 for hybrid bonding. In an aspect, the first interface layer 217 may be planarized (e.g., through CMP) such that the first interconnects 218 are exposed at the upper surface thereof prior to hybrid bonding. Indeed, some or all of the first substrate 211, the first device layer 213, the first routing layer 215, and the first interface layer 217 may be planarized.

Also as seen in FIG. 2B, the second tier 220 may include, from bottom to top, a second interface layer 227, a second device layer 223, and a second epitaxial layer 221. The second interface layer 227 may be the hybrid bonding layer of the second tier 220. The second interface layer 227 may include one or more second interconnects 228 isolated from each other by a second insulator 229. The second insulator 229 may be an oxide (e.g., SiO2). The second interconnects 228 may be electrically conductive. For example, the second interconnects 228 may be formed from metal (e.g., Cu).

The lower surface of the second interface layer 227 may be the lower surface of the second tier 220 for hybrid bonding. In an aspect, the second interface layer 227 may be planarized (e.g., through CMP) such that the second interconnects 228 are exposed at the lower surface thereof prior to hybrid bonding. Indeed, some or all of the second substrate 221, the second device layer 223, the second routing layer 225, and the second interface layer 227 may be planarized.

When the first and second tiers 210, 220 (through the first and second interface layers 217, 227) are hybrid bonded, there may be oxide-oxide and Cu—Cu bondings. More generally, there are at least insulator-insulator and conductor-conductor bondings. Also when hybrid bonded, the first interconnects 218 may be electrically coupled to corresponding second interconnects 228.

The second device layer 223 may be a layer that includes the second technology devices 224 isolated from each other through isolation insulator such as interlayer dielectric (ILD). The second technology devices 224 may be III-V devices such PAs, LNAs, and so on. The transistors that form the III-V devices may be high electron mobility transistors (HEMTs) and/or heterojunction bipolar transistors (HBTs) formed of gallium arsenide (GaAs), indium phosphide (InP), gallium nitride (GaN), etc.

The second device layer 223 may also include one or more second signal routers 226 configured to route signals from/to the second technology devices 224. For example, the second routing layer 225 may be a redistribution layer (RDL). The second signal routers 226 may be formed from one or more metallizations (e.g., metallization M1-G illustrated in FIG. 2B).

One or more second signal routers 226 may be electrically coupled to one or more second interconnects 228. Also, one or more second signal routers 226 may be electrically coupled to one or more second technology devices 224. That means that there can be one or more second technology devices 224 electrically coupled to one or more second interconnects 228. As illustrated in the particular instance illustrated in FIG. 2B, the second technology devices 224 and/or the second interconnects 218 may be connected to the second signal routers 226.

Note that when the first and second tiers 210, 220 are hybrid bonded, at least one first technology device 214 may be electrically coupled to at least one second technology device 224 through, in order, at least one first interconnect 218 and at least one second interconnect 228 due to the first and second signal routers 216, 226.

The second epitaxial layer 221 may be an undoped III-V layer. For example, second epitaxial layer 221 may be an undoped GaAs layer. One or more electrically conductive through-vias 222 may be formed within the second epitaxial layer 221. For example, the through-vias 222 may extend from upper to lower surfaces of the second epitaxial layer 221. When the second epitaxial layer 221 is an undoped GaAs layer, then the through-vias 222 may also be referred to as through-GaAs-vias (TGV) 222. The TGVs 222 or through-vias 222 in general may be formed of copper. The through-vias 222 may be electrically coupled to the second technology devices 224 and/or the second signal routers 226.

Further as seen in FIG. 2B, the third tier 230 may include one or more IPDs 234 and/or one or more third signal routers 236 formed from one or more metallizations (e.g., metallizations M1, M2, M3, M4, M5 illustrated in FIG. 2B). The IPDs 234 may include one or more HQ-IPDs 234 such as capacitors, inductors, and so on. The IPDs may form one or more passive circuits. For example, HQ inductor and metal-insulator-metal (MIM) capacitor are shown in FIG. 2B to form a LC circuit, which may be utilized as a filter or a matching circuit. The RDL/stacking via metal (e.g., M3/M4/M5) and pad structure right over the GaAs PA device 224 connecting to WLP ball 240 can further enhance the device thermal performance, by dissipating the heat generated from the channel of the GaAs HEMT source electrodes, to the electrical/thermal ground on the laminate substrate 170.

As seen in FIG. 2B, note that the at least some of the through-vias 222 extend into at least a portion of the second device layer 223 to thermally couple with the GaAs PA device 224. For example, these through-vias 222 may be in contact with or at least in very close proximity to the electrodes of the GaAs PA device 224. Moreover, the metallizations M1/M2/M3/M4/M5 and the bump 240 may be vertically aligned so as to provide a direct thermal path. In FIG. 2B, the through-via 222, metallizations M1-M5, and the bump 240 are vertically stacked and in contact to provide both electrical and thermal coupling. Generally, it may be said that a plurality of metalizations of the third tier 230 and at least one bump 240 may be thermally coupled to and vertically aligned with at least one second technology device 224 so as to provide a vertical thermal path for the at least one second technology device 224.

The IPDs 234 and/or the signal routers 236 may be electrically coupled to the through-vias 222. As illustrated in the particular instance illustrated in FIG. 2B, the IPDs 234 and/or the signal routers 236 may be connected directly to the through-vias 222. When the IPDs 234 and/or the signal routers 236 are electrically coupled to the through-vias 222, then the following may result:

- at least one IPD 234 is electrically coupled to at least one first technology device 214 (e.g., through an electrical path comprising through-via 222, second signal router 226, second interconnect 228, first interconnect 218, first signal router 216);
- at least one IPD 234 is electrically coupled to at least one second technology device 224 (e.g., through an electrical path comprising through-via 222);
- at least one third signal router 236 is electrically coupled to at least one first technology device 214 (e.g., through an electrical path comprising through-via 222, second signal router 226, second interconnect 228, first interconnect 218, first signal router 216);
- at least one third signal router (236) is electrically coupled to at least one second technology device 224 (e.g., through an electrical path comprising through-via 222), or
- any combination of the above.

When the stacked circuit 200 does include the optional thermal spreader 260, the through-vias 222 may also extend through the optional thermal spreader 260 such that the IPDs 234 and/or the signal routers 236 are electrically coupled to the through-vias 222. The thermal spreader 260 may formed from aluminum nitride (AlN), e.g., through physical vapor deposition (PVD), such as reactive sputtering of aluminum with nitrogen plasma. Alternatively or in addition thereto, the thermal spreader 260 may be formed of diamond, e.g., through chemical vapor deposition (CVD). In general, any material that combines high electrical resistivity with high thermal conductivity may be candidates to serve as the thermal spreader 260.

The bumps 240 formed on the third tier 230 may be configured to enable signal exchanges between the stacked circuit 200 and devices/packages external to the stacked circuit 200. Example of bumps 240 may include WLP solder or Cu bumps (e.g., for flipchip (FC) bonding).

The following are a list (not necessarily exhaustive) of advantages of the example stacked circuit 200:

1) Power: Reduced power consumption with high PAE due to III-V technology for PA and HQ-IPD based LC filter used for both 5G RFIC and MMIC (PA, LNA, SW, filter);
2) Performance: Electrical and thermal performance benefits from
    (i) cost-effective CMOS for baseband transceiver controller/logic & power tracker,
    (ii) III-V frontend devices (PA, LNA, SW, etc.) in terms of PAE, NF, RonCoff, and
    (iii) high-Q integrated passives (MIM caps and inductors: thick Cu) as LC matching/filter components directly over RF frontend components to reduce RF loss due to interconnect over the substrate;
3) Area: Compact 3DIC chip size realized with the extended monolithic 3DIC to reduce inter-module metal routing though expensive laminate substrate which can introduce additional substrate RF loss;
4) Thermal: Improved thermal performance through shorter thermal conductive path for the RF PA heat source to thermal ground, in the case of
    (i) III-V GaAs HEMT over Si-CMOS, where GaAs PA heat source is directly dissipated through stacking via to WLCSP Ball,
    (ii) PVD AN or CVD diamond (from SoD (silicon on diamond)) film as thermal spreader to reduce PA junction temperature (Tj) and enhance power efficiency, and thus enhance device reliability;
5) Cost: Reduced cost through reduced overall chip size with 3DIC device architecture that allows smaller module and laminate area with improved thermal performance of WBG device and high-Q IPD/LC filters;
6) Testability: 3DIC (Wafer level heterogenous integration) allows wafer-level test of WAT/PCM and C/P wafer sort, as well as calibration of gain control in phase arrays at a reduced cost, vs the test at the package module.

Figure 3:
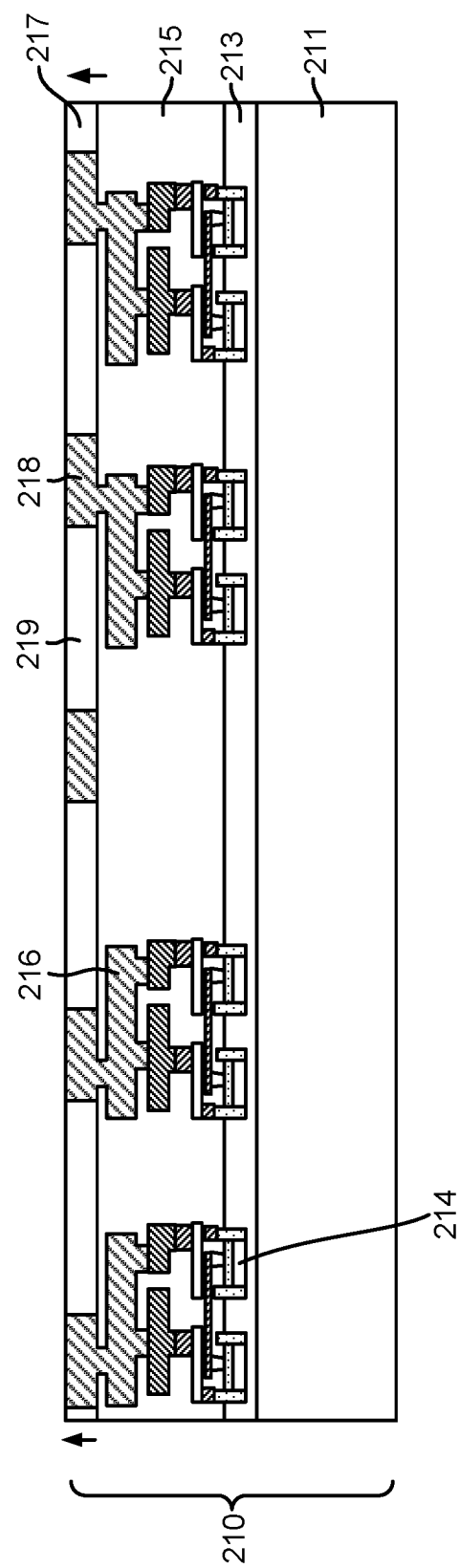

FIGS. 3-10B illustrate examples of different stages of fabricating a stacked circuit such as the stacked circuit 200 illustrated in FIGS. 2A and 2B. As indicated, the stacked circuit 200 is an example of a 3DIC according to one or more aspects. FIG. 3 illustrates an example of a stage in which the first tier 210 is formed. As seen, the first device layer 213, with the first technology devices 214 therein, may be formed on the first substrate 211 (e.g., Si substrate), the first routing layer 215 may be formed on the first device layer 213, and the first interface layer 217 may be formed on the first routing layer 215. Any of the first substrate 211, the first device layer 213, the first routing layer 215, and the first interface layer 217 may be planarized (e.g., through CMP).

Figure 4A:
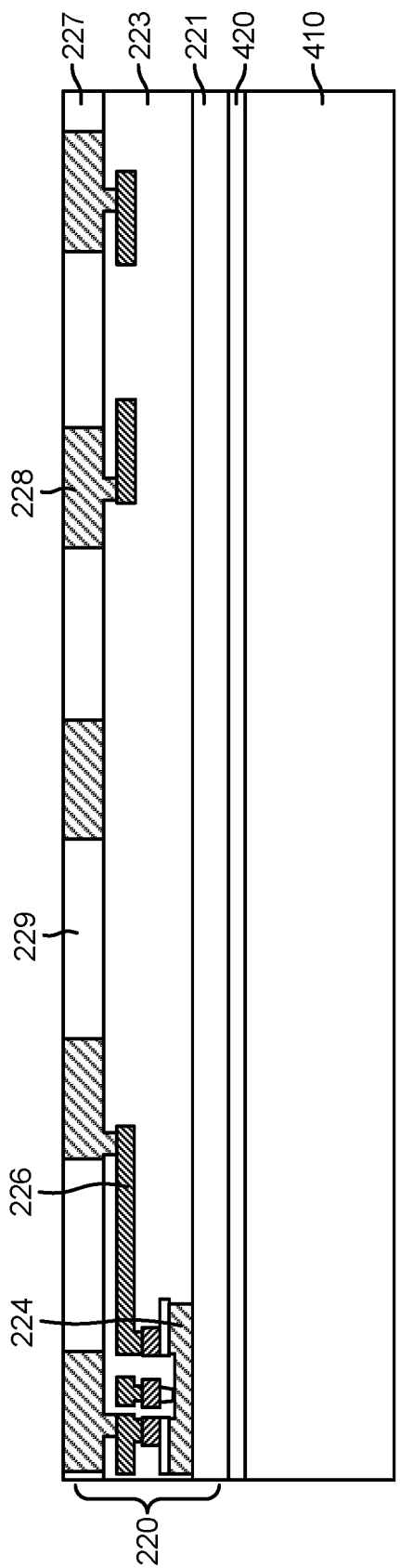
Figure 4B:
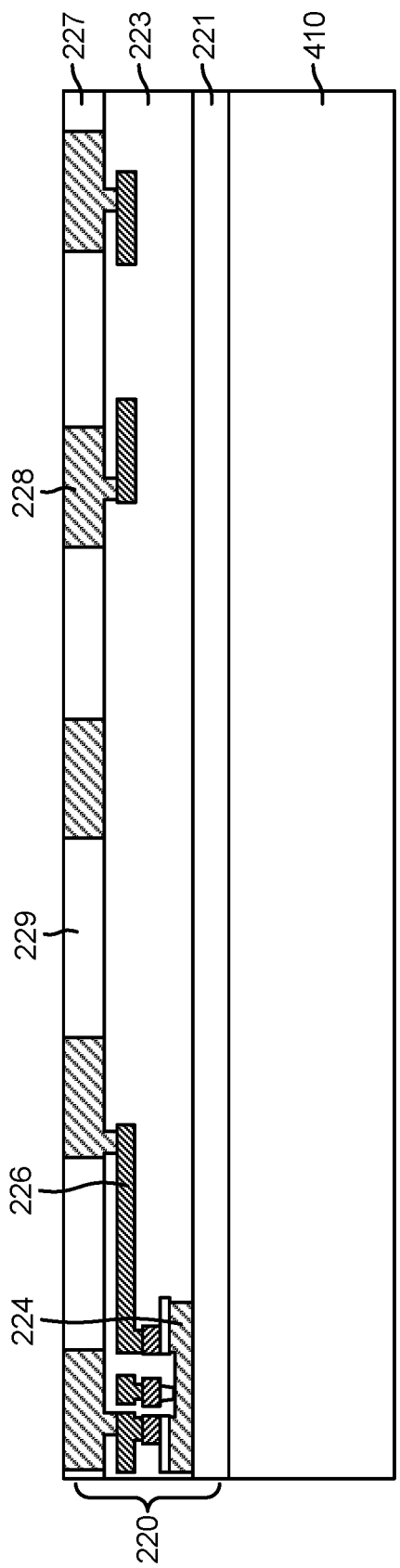
Figure 4C:
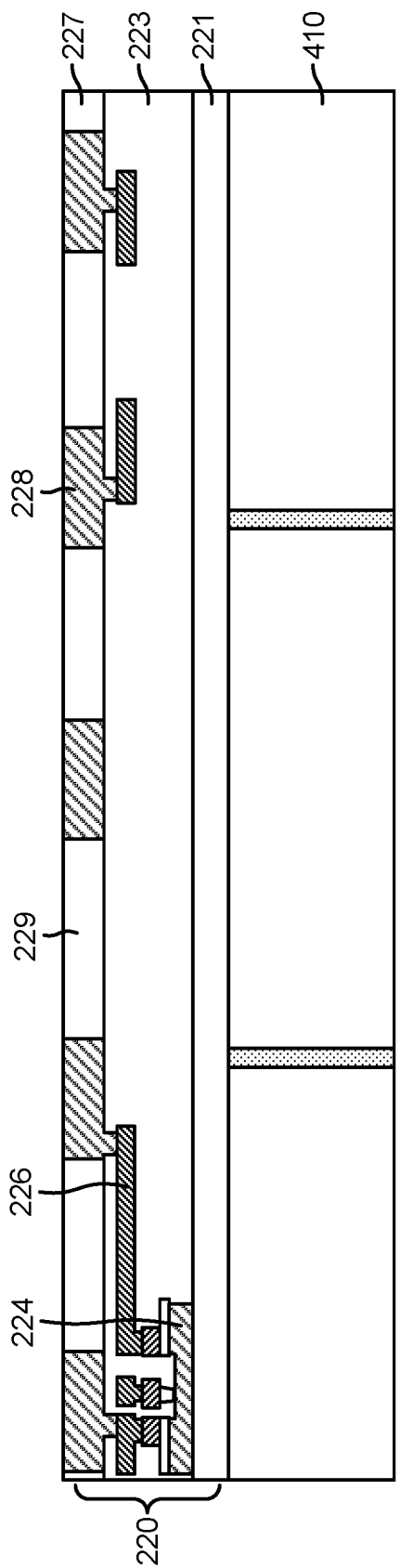

FIGS. 4A, 4B, and 4C illustrate examples of stages in which the second tier 220 is formed. In FIG. 4A, a buffer layer 420 (e.g., germanium (Ge) buffer) may be formed on a second carrier 410, the second epitaxial layer 221 may be formed on the buffer layer 420, the second device layer 223 with the second technology devices 224 and second signal routers 226 therein, may be formed on the second epitaxial layer 221, and the second interface layer 227 may be formed on the second device layer 223.

When the second carrier 410 is a Si carrier wafer and the second epitaxial layer 221 is the undoped GaAs layer, there can be a significant lattice-mismatch between the second carrier 410 and the second epitaxial layer 221. The Ge buffer layer 420 helps to mitigate the lattice mismatch between the second carrier 410 and the second epitaxial layer 221.

However, as illustrated in FIGS. 4B and 4C, if the second carrier 410 is also a III-V wafer (e.g., GaAs wafer), then there can be little to no lattice mismatch between the second carrier 410 and the second epitaxial layer 221. In such instances, the buffer layer 420 need not be provided. The second carrier 410 in FIG. 4C may comprise a plurality of sliced GaAs substrates, with the intention to form a large-area reconstituted wafer to match to the first-tier wafer for face-face (F2F) hybrid bonding (HB), that requires the wafers/substrates to be the same size. For example, to form a 12-inch (300 mm) size of GaAs engineering second-tier wafer to match the 12-inch Si-CMOS first-tier wafer.

Figure 5A:
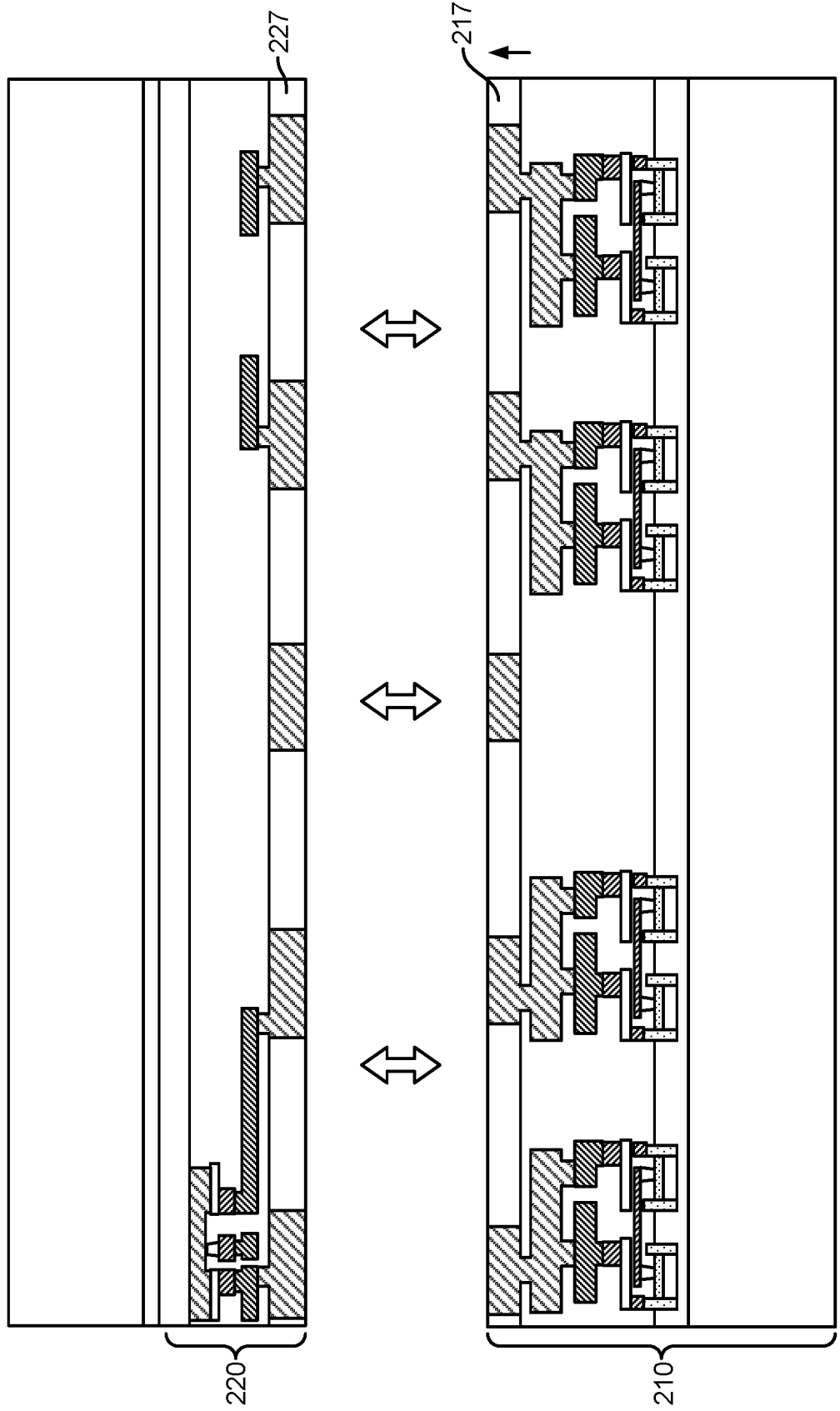
Figure 5B:
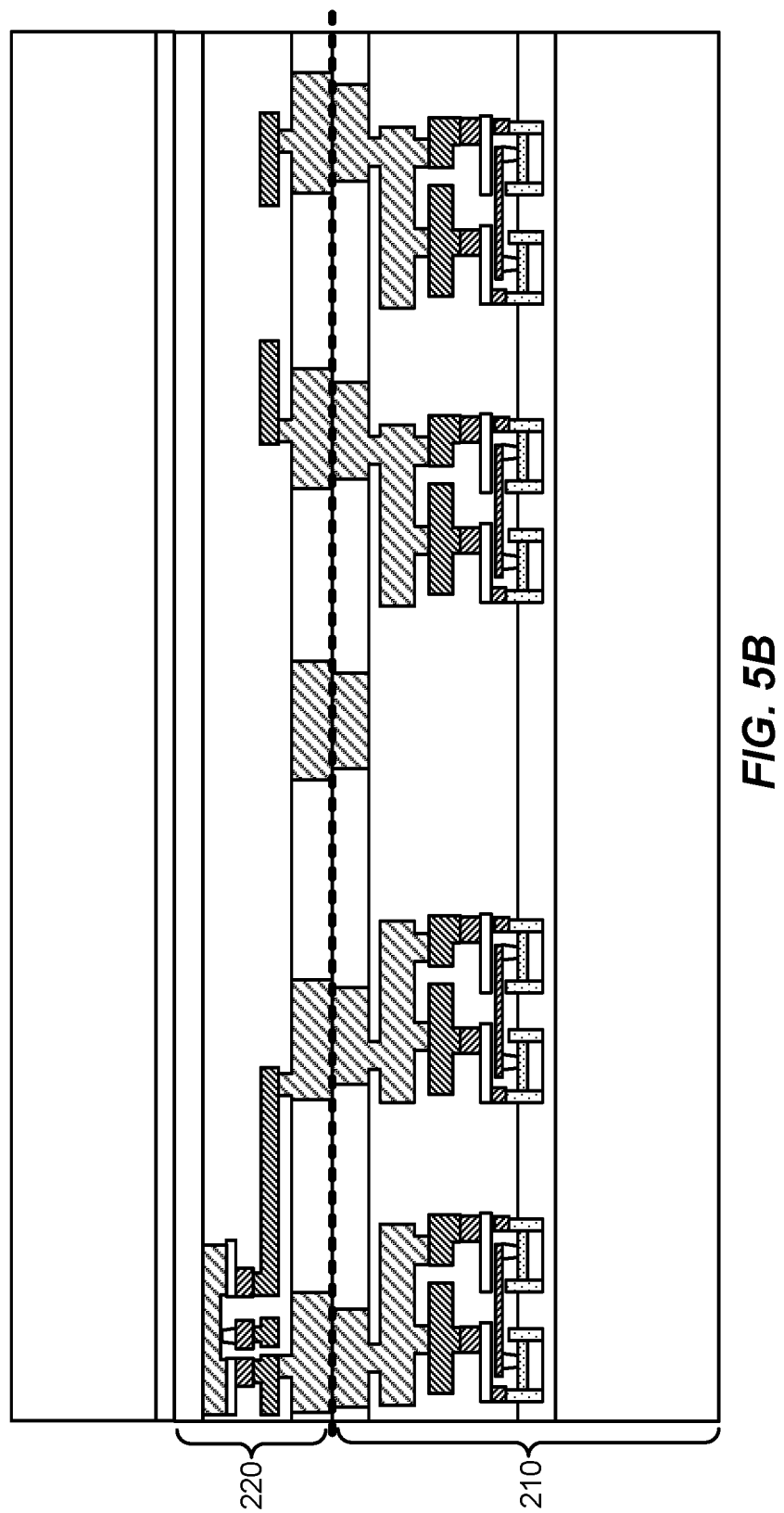

FIGS. 5A and 5B illustrate examples of stages of hybrid bonding the first and second tiers. In FIG. 5A, the second tier 220 formed in FIG. 4A is oriented, e.g., flipped, such that the second interface layer 227 is face-to-face (F2F) with the first interface layer 217 of the first tier 210. In FIG. 5B, the first and second tiers 210, 220 are brought together and hybrid bonded.

In an aspect, hybrid bonding may be viewed as being more significant than simply bringing the first and second interface layers 217, 227 in physical contact with other. While not shown, the first and second interface layers 217, 227 may be heat treated after bringing them into contact, such as oxide-fusion bond and following by Cu metal diffusion bond. Since the CTE of metal is greater than the CTE of the oxides, heating closes any gaps that may exist between the first and second interconnects 218, 228. As such, desired electrical coupling between the first and second interconnects 218, 228 can be ensured. While not shown, the hybrid bonding of the second tiers 220 of FIGS. 4B and 4C to the first tier 210 may be similar.

Figure 6:
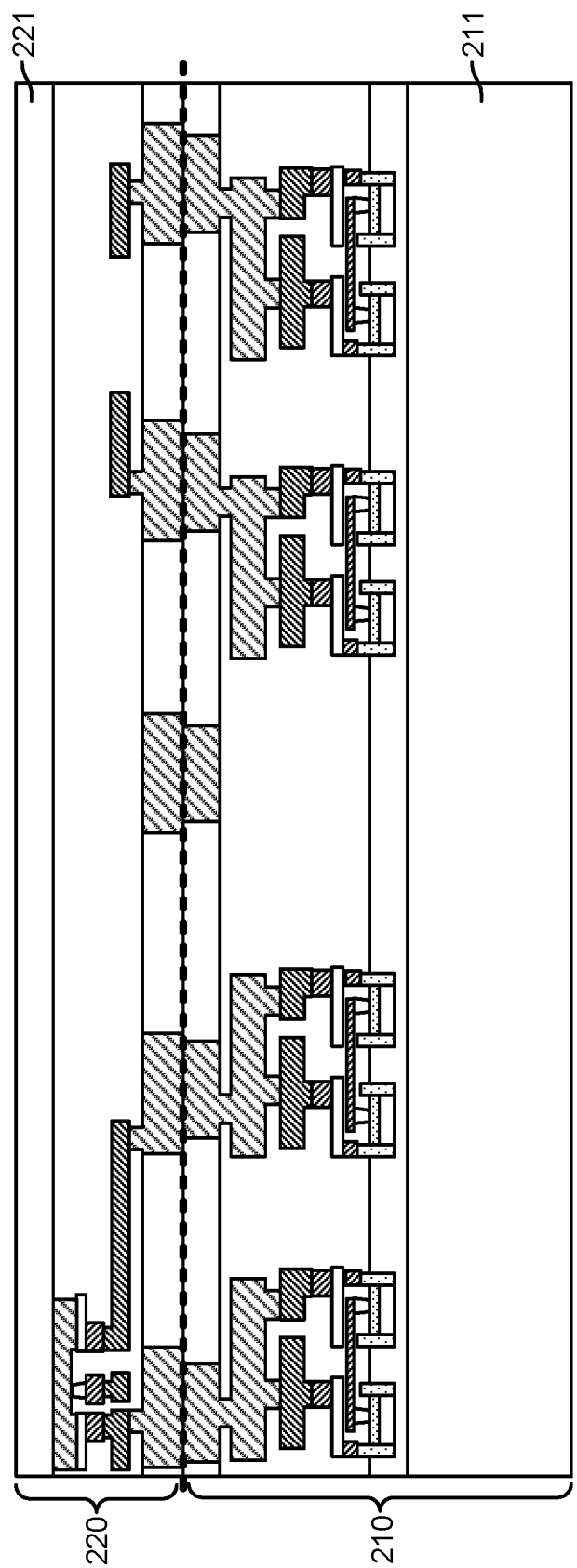

FIG. 6 illustrates an example of a stage in which the second carrier 410 may be removed. The buffer layer 420 may also be removed if present. The result is that the second epitaxial layer 221 may be exposed. While not shown, the first substrate 211 may be thinned.

Figure 7:
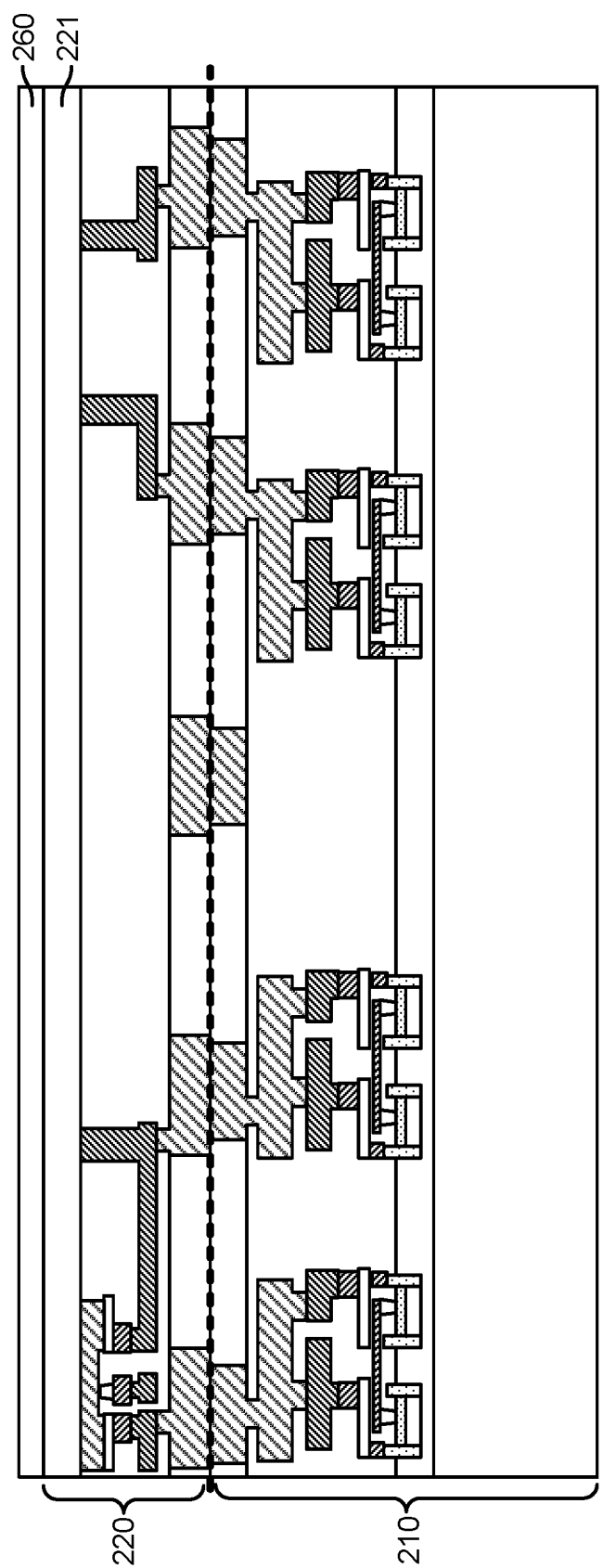

FIG. 7 illustrates an example of a stage in which the optional thermal spreader 260 may be formed on the second epitaxial layer 221 of the second tier 220. The thermal spreader 260 may be formed through physical vapor deposition (PVD) of aluminum nitride (AlN). Alternatively or in addition thereto, the thermal spreader 260 may be formed through chemical vapor deposition (CVD) of diamond.

Figure 8A:
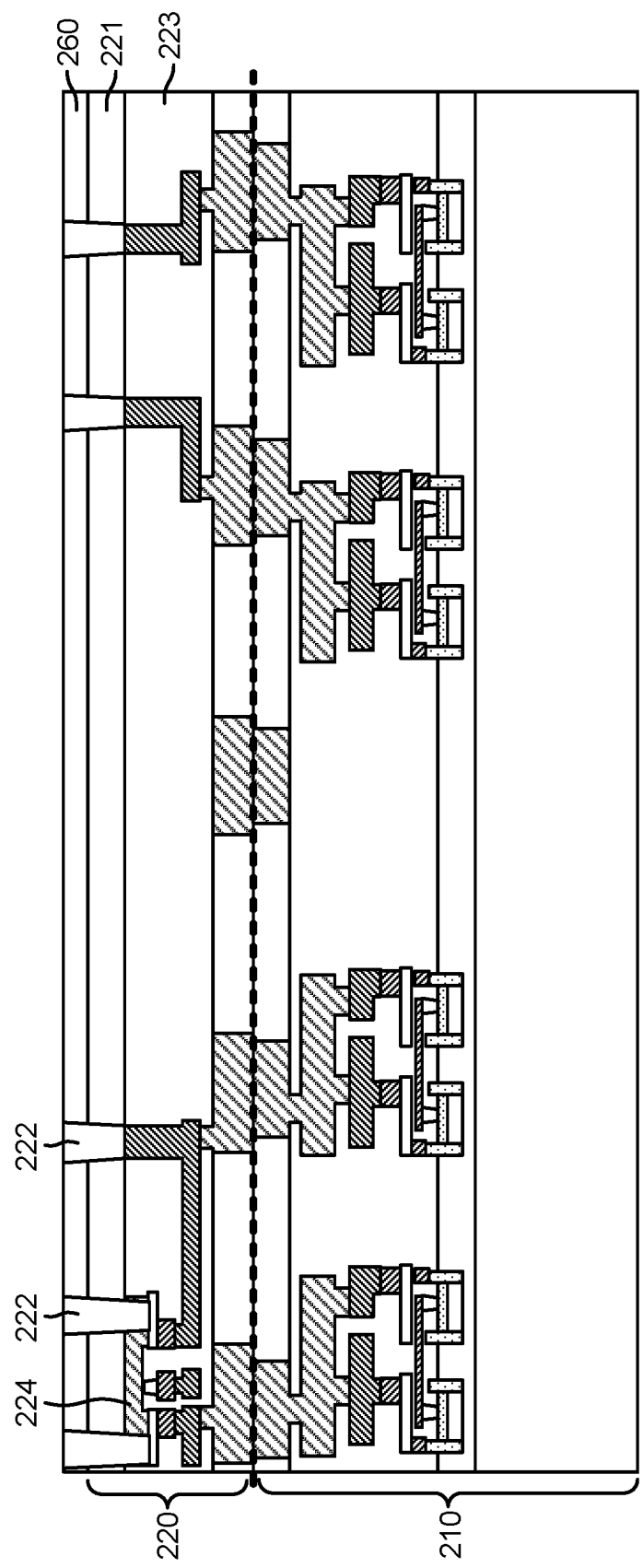
Figure 8B:
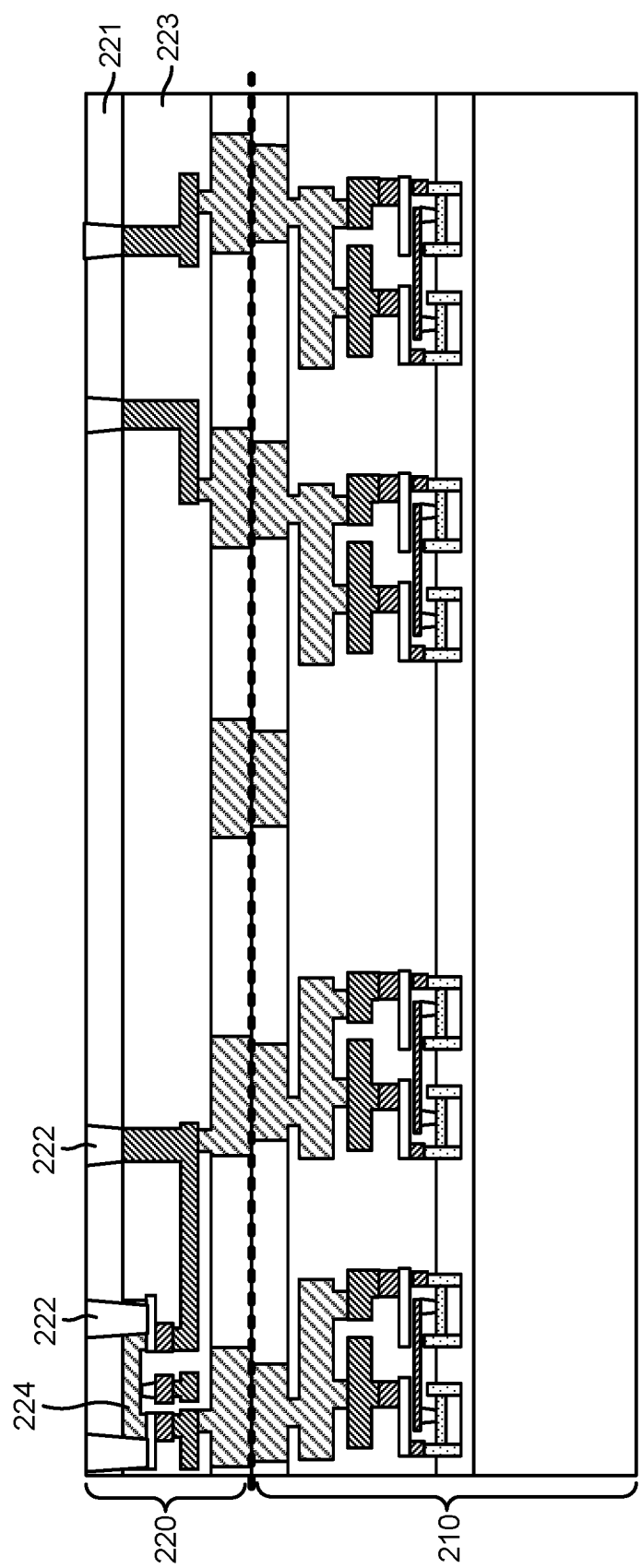

FIGS. 8A and 8B illustrate examples of stages of forming the through-vias 222. If the thermal spreader 260 is present, then the through-vias 222 may be formed through the thermal spreader 260 and the second epitaxial layer 221 as seen in FIG. 8A. If the thermal spreader 260 is not present, then the through-vias 222 may be formed through the second epitaxial layer 221 as seen in FIG. 8B.

Recall from above that in some aspect, one or more of the second technology device 224 (e.g., GaAs PA) may generate a significant amount of heat during its operation. In those instances, it may be desirable to provide a direct thermal path. To this end, some of the through-vias 222 may also extend at least partially into the second device layer 223 to thermally couple with the heat generating second technology device 224 as seen in both FIGS. 8A and 8B. As will be seen in subsequent fabrication stages, the direct thermal path may be completed with the third tier 230 and bumps 240.

Figure 9A:
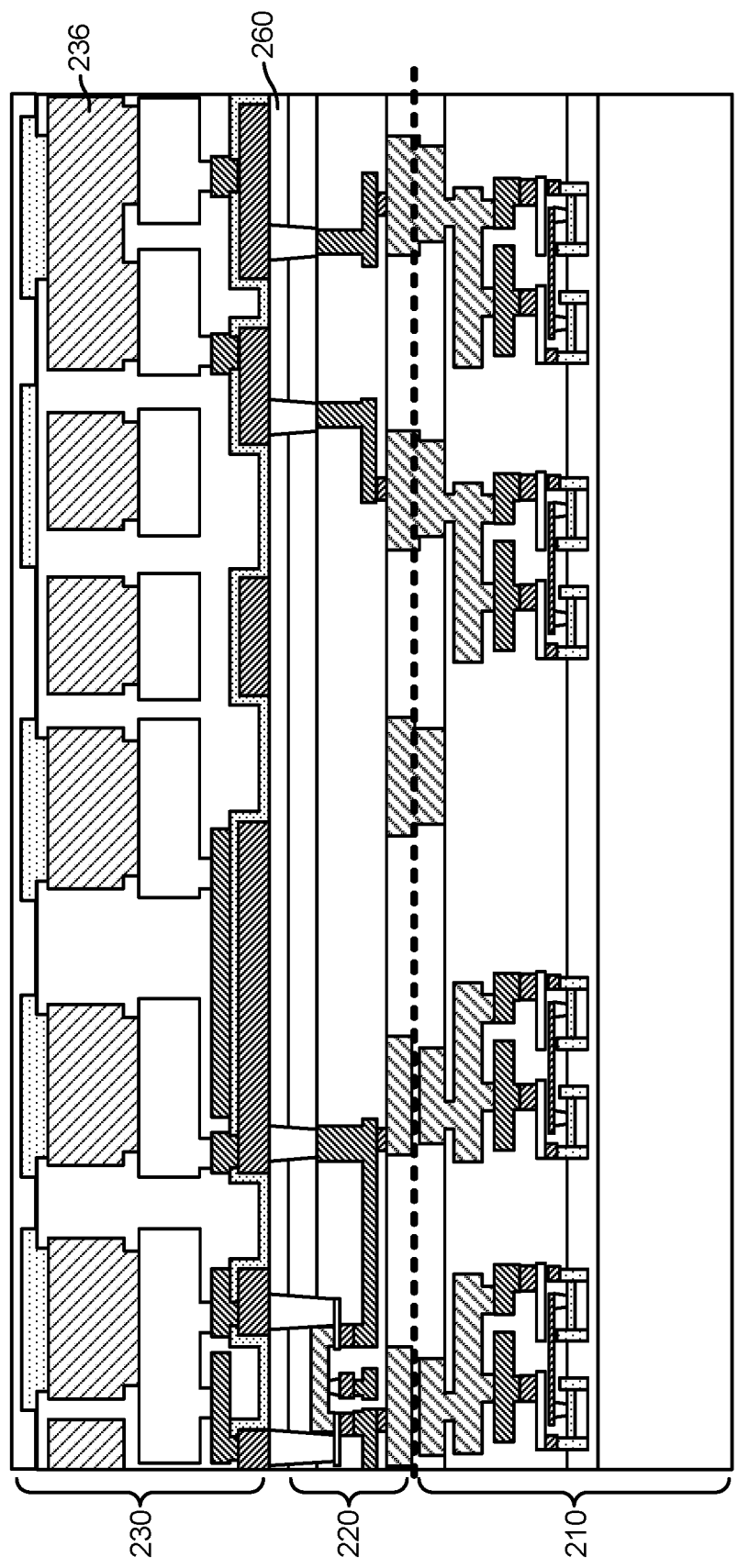
Figure 9B:
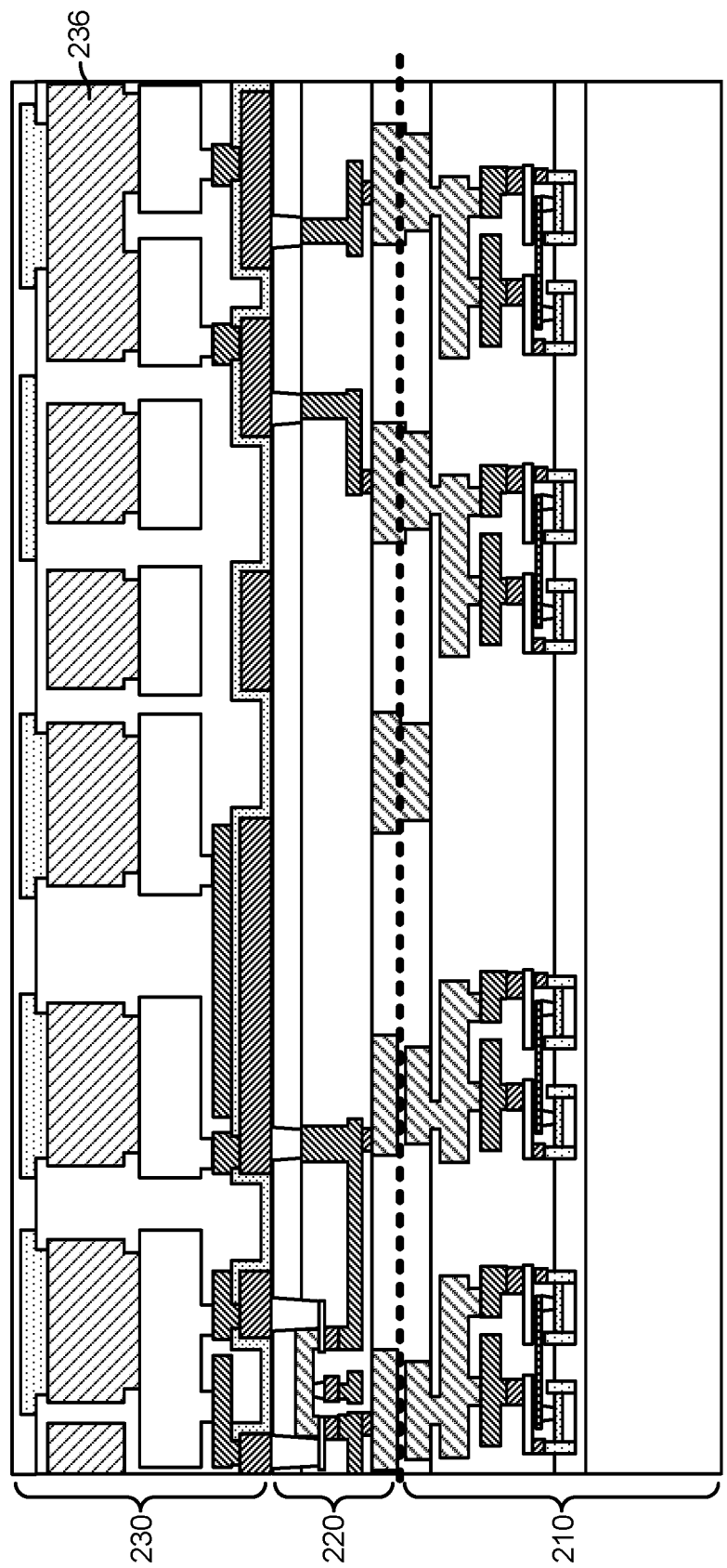

FIGS. 9A and 9B illustrate examples of stages of forming the third tier 230 on the second tier 220. FIG. 9A illustrates forming the third tier 230 by a series of PVD, PECVD, electro-plating, and spin-coating/thermal curing process steps for metal and dielectric layers, when the thermal spreader 260 is present, and FIG. 9B illustrates forming the third tier 230 when the thermal spreader 260 is not present.

Figure 10A:
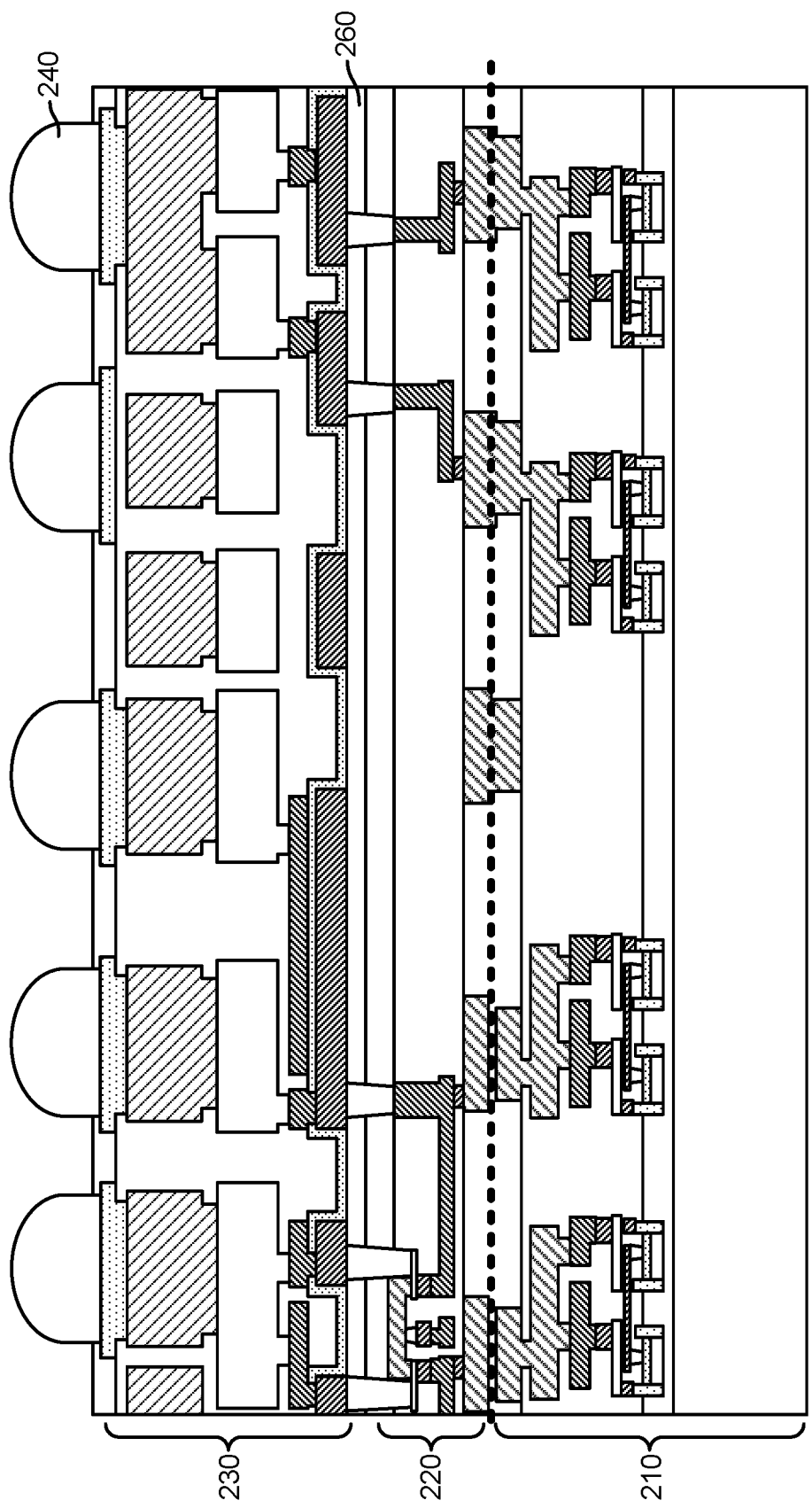

FIGS. 10A and 10B illustrate examples of stages of forming the bumps 240 on the third tier 230. FIG. 10A illustrates forming the bumps 240 when the thermal spreader 260 is present, and FIG. 10B illustrates forming the bumps 240 when the thermal spreader 260 is not present. FIGS. 10A and 10B also illustrate examples of stacked circuits according to one or more aspects.

FIGS. 11-14 illustrate flow charts of an example method of fabricating a stacked circuit such as the stacked circuits illustrated in FIGS. 2, 10A, and/or 10B. It should be noted that not all illustrated blocks of FIGS. 11-14 need to be performed, i.e., some blocks may be optional. Also, the numerical references to the blocks of these figures should not be taken as requiring that the blocks should be performed in a certain order.

Figure 11:
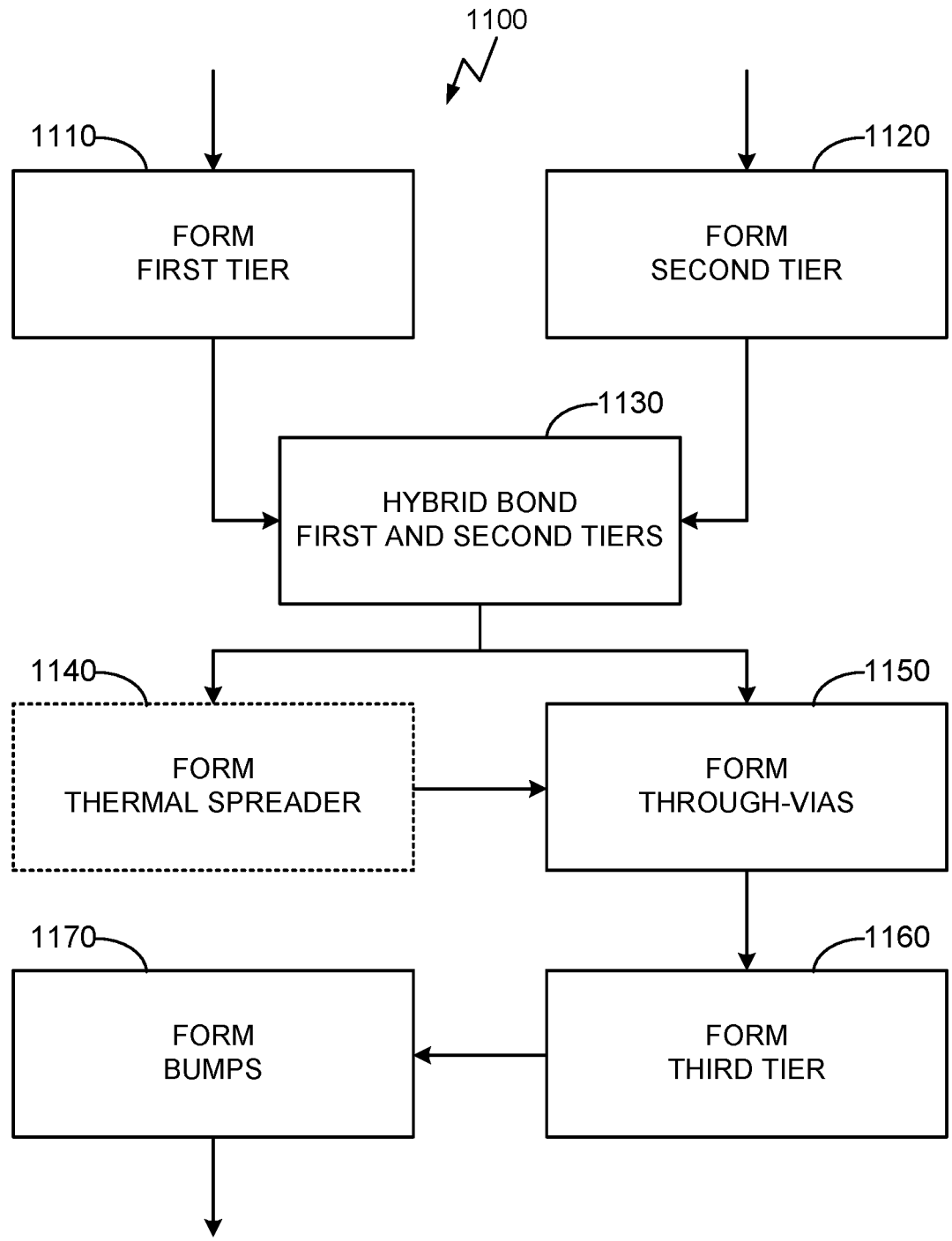
FIGS. 11-14 illustrate flow charts of an example method of fabricating a 3D stacked circuit according to one or more aspects.
Figure 12:
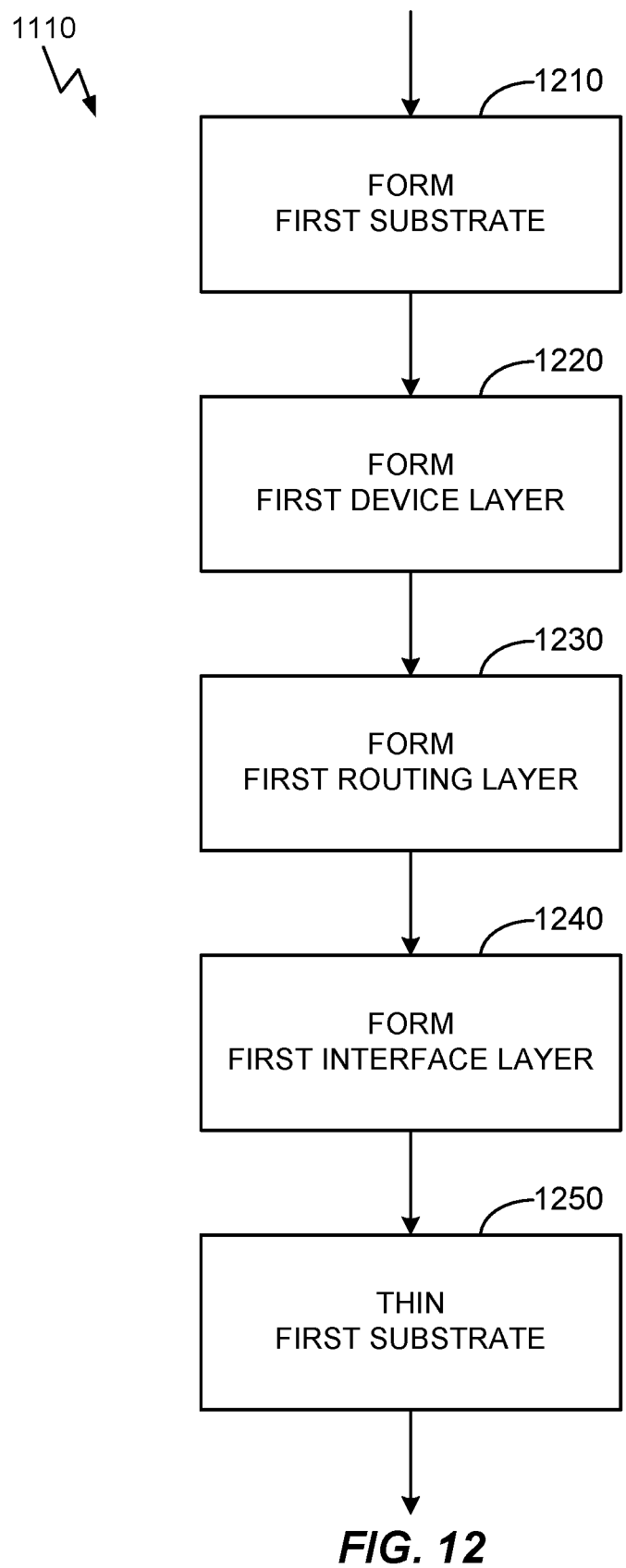

In block 1110 of FIG. 11, the first tier 210 may be formed. FIG. 12 illustrates a flow chart of an example process to perform block 1110. In block 1210, the first substrate 211 (e.g., Si substrate) may be formed. In block 1220, the first device layer 213 including the first technology devices 214 may be formed on the first substrate 211. In block 1230, the first routing layer 215 including the first signal routers 216 may be formed on the first device layer 213. In block 1240, the first interface layer 217, including the first interconnects 218, may be formed on the first routing layer 215. Again, as mentioned, one or more layers of the first tier 210 may be planarized. In block 1250, the first substrate 211 may be thinned. FIG. 3 may correspond to blocks 1110 and 1210-1240, and FIG. 6 may correspond to block 1250.

Figure 13:
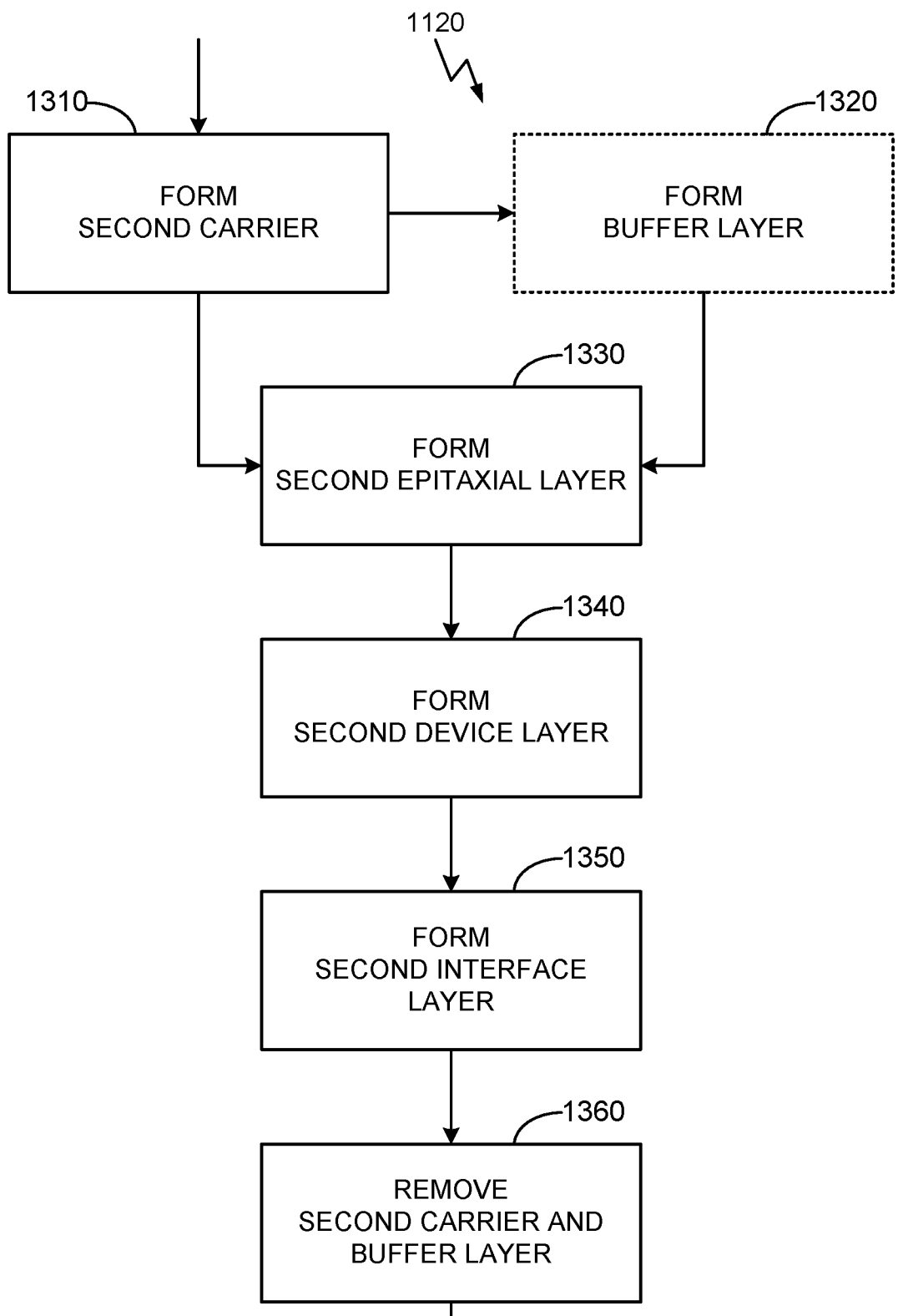

Referring back to FIG. 11, the second tier 220 may also be formed. FIG. 13 illustrates a flow chart of an example process to perform block 1120. In block 1310, the second carrier 410 may be formed. In block 1320 which may be optional (depicted by a dashed box), the buffer layer 420 may be formed on the second carrier 410 (e.g., when the second carrier 410 is Si wafer and the second epitaxial layer 221 is GaAs). In block 1330, the second epitaxial layer 221 may be formed on the second carrier 410 (with or without the buffer layer 420). In block 1340, the second device layer 223 including the second devices 224 and the second signal routers 226 may be formed on the second epitaxial layer 221. In block 1350, the second interface layer 227, including the second interconnects 228, may be formed on the second device layer 223. Again, as mentioned, one or more layers of the second tier 220 may be planarized. In block 1360, the second carrier 410 (and the buffer layer 420 if present) may be removed. FIGS. 4A, 4B, and 4C may correspond to blocks 1120 and 1310-1350, and FIG. 6 may correspond to block 1360.

Figure 14:
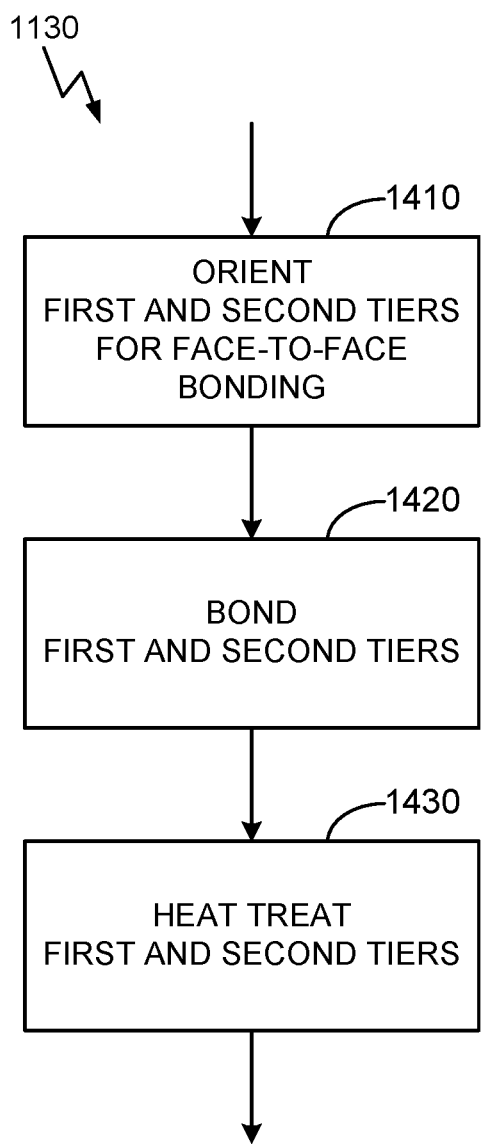

Referring back to FIG. 11, it should be noted that blocks 1110 (forming the first tier 210) and 1120 (forming the second tier 220) may take place independently. In block 1130, the first and second tiers 210, 220 may be hybrid bonded. FIG. 14 illustrates a flow chart of an example process to perform block 1130. In block 1410, the first and/or the second tier 210, 220 may be oriented such that the first interface layer 217 and the second interface layer 227 are face-to-face (F2F) with each other. The first and second tiers 210, 220 may then be hybrid bonded. For example, in block 1420, the first and second interface layers 217, 227 may be bonded, e.g., brought into contact, such that the one or more first interconnects 218 are electrically coupled to corresponding one or more second interconnects 228. The first and second insulators 219, 229 may also be brought into contact with each other. In block 1430, the first and second interface layers 217, 227 may be heat treated, e.g., so as to close any gaps that may exist between the first and second interconnects 218, 228. FIGS. 5A and 5B may correspond to blocks 1130 and 1410-1430.

It should be noted that blocks 1250 (thinning the first substrate 211) and 1360 (removing the second carrier 410 and the buffer layer 420) may be performed after hybrid bonding the first and second tiers 210, 220. As mentioned, blocks 1250 and 1360 may correspond to FIG. 6.

Referring back to FIG. 11, in block 1140 which may be optional (depicted by a dashed box), the thermal spreader 260 may be formed on the second epitaxial layer 221 such that when the third tier 230 is formed, the second epitaxial layer 221 may be in between the second and third tiers 220, 240. As mentioned, thermal spreader 260 may be formed as PVD AN and/or CVD diamond. FIG. 7 may correspond to block 1140.

In block 1150, the through-vias 222 may be formed through the second epitaxial layer 221. Some of the through-vias 222 may extend into the second device layer 223 for thermal coupling with a heat generating second technology device 224 (e.g., GaAs PA device). If present, the through-vias 222 may also be formed through the thermal spreader 260. FIG. 8A (with the thermal spreader 260) and 8B (without the thermal spreader 260) may correspond to block 1150.

In block 1160, the third tier 230, including the IPDs 234 and/or the third signal routers 236, may be formed on the second tier 220. FIG. 9A (with the thermal spreader 260) and 9B (without the thermal spreader 260) may correspond to block 1160.

In block 1170, the bumps 240 may be formed on the third tier 230. FIG. 10A (with the thermal spreader 260) and 10B (without the thermal spreader 260) may correspond to block 1160. Again, the metallizations of the third tier and bumps 240 may overlap vertically to provide a direct thermal path.

Figure 15:
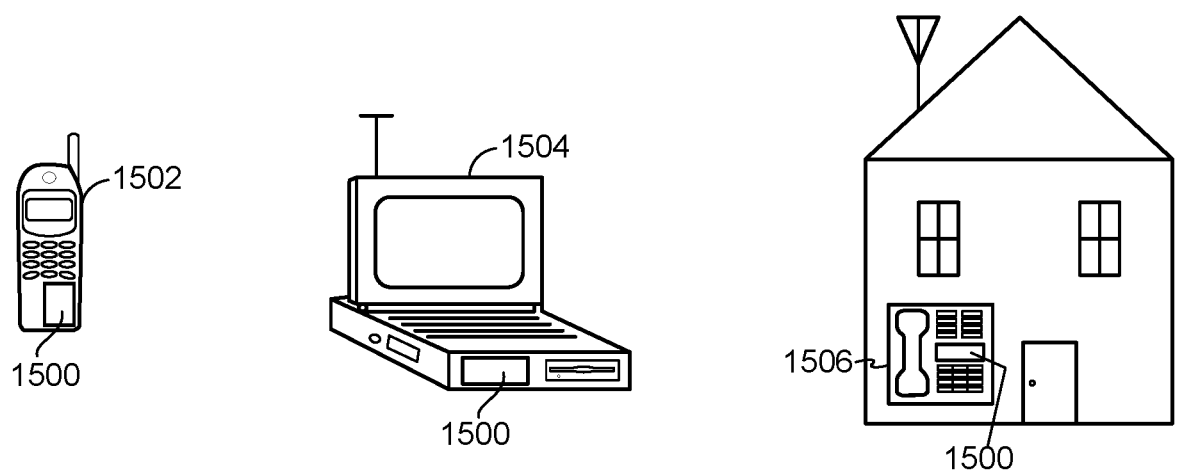
FIG. 15 illustrates examples of devices with a 3D stacked circuit integrated therein according to one or more aspects.

FIG. 15 illustrates various electronic devices that may be integrated with any of the aforementioned stacked circuit 200. For example, a mobile phone device 1502, a laptop computer device 1504, a terminal device 1506 as well as wearable devices, portable systems, that require small form factor, extreme low profile, may include a device/package 1500 that incorporates the stacked circuit 200 as described herein. The device/package 1500 may be, for example, any of the integrated circuits, dies, integrated devices, integrated device packages, integrated circuit devices, device packages, integrated circuit (IC) packages, package-on-package devices, system in package devices described herein. The devices 1502, 1504, 1506 illustrated in FIG. 15 are merely exemplary. Other electronic devices may also feature the device/package 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A stacked circuit, comprising:
a first tier comprising one or more first technology devices of a first semiconductor type and one or more first interconnects, at least one first interconnect being electrically coupled to at least one first technology device; and
a second tier on the first tier, the second tier comprising one or more second technology devices of a second semiconductor type different from the first semiconductor type and one or more second interconnects, and at least one second interconnect being electrically coupled to at least one second technology device,
wherein an upper surface of the first tier and a lower surface of the second tier are hybrid bonded to each other in which
one or more portions of a first insulator exposed at the upper surface of the first tier are bonded to corresponding one or more portions of a second insulator exposed at the lower surface of the second tier, and
the one or more first interconnects exposed at the upper surface of the first tier are bonded to the one or more second interconnects exposed at the lower surface of the second tier such that the one or more first interconnects are electrically coupled to the one or more second interconnects.

2. The stacked circuit of claim 1,
wherein the one or more first interconnects and the one or more second interconnects are copper, and
wherein the first insulator and the second insulator are oxides.

3. The stacked circuit of claim 1, wherein the first technology devices are Si-CMOS devices and the second technology devices are III-V devices.

4. The stacked circuit of claim 1, wherein the first tier comprises:

a first device layer on a first substrate, the first device layer comprising the one or more first technology devices; and a first interface layer on the first device layer, the first interface layer comprising the one or more first interconnects and the first insulator, wherein the first interface layer is configured such that the one or more first interconnects are electrically coupled to the one or more first technology devices, and wherein an upper surface of the first interface layer is the upper surface of the first tier such that at least one first technology device is electrically coupled to at least one second technology device through, in order, at least one first interconnect and at least one second interconnect.

5. The stacked circuit of claim 4, wherein the first tier further comprises:

a first routing layer in between the first device layer and the first interface layer, the first routing layer comprising one or more first signal routers configured such that the one or more first interconnects are electrically coupled to the one or more first technology devices through the one or more first signal routers.

6. The stacked circuit of claim 1, wherein the second tier comprises:

a second interface layer on the first tier, the second interface layer comprising the one or more second interconnects and the second insulator; and a second device layer on the second interface layer, the second device layer comprising the one or more second technology devices, wherein the second interface layer is configured such that the one or more second interconnects are electrically coupled to the one or more second technology devices, and wherein a lower surface of the second interface layer is the lower surface of the second tier such that at least one first technology device is electrically coupled to at least one second technology device through, in order, at least one first interconnect and at least one second interconnect.

7. The stacked circuit of claim 6, wherein the second device layer also comprises one or more second signal routers configured such that the one or more second interconnects are electrically coupled to the one or more second technology devices through the one or more second signal routers.

8. The stacked circuit of claim 6, wherein the second tier further comprises:

an epitaxial layer on the second device layer; and
one or more through-vias configured to extend from an upper surface to a lower surface of the epitaxial layer such that
at least one through-via is electrically coupled to at least one first technology device, and
at least one through-via is electrically coupled to at least one second technology device.

9. The stacked circuit of claim 1, further comprising:
a third tier on the second tier, the third tier comprising one or more high quality (HQ) integrated passive devices (IPD) and/or one or more third signal routers, wherein the one or more HQ-IPDs and/or the one or more third signal routers are configured such that
at least one HQ-IPD is electrically coupled to at least one first technology device,
at least one HQ-IPD is electrically coupled to at least one second technology device,
at least one third signal router is electrically coupled to at least one first technology device,
at least one third signal router is electrically coupled to at least one second technology device, or
any combination thereof.

10. The stacked circuit of claim 9, wherein the one or more HQ-IPDs comprise one or more inductors, one or more capacitors, or any combination thereof.

11. The stacked circuit of claim 9, further comprising:
a thermal spreader between the second tier and the third tier; and
one or more through-vias configured to extend from an upper surface to a lower surface of the thermal spreader such that
at least one HQ-IPD is electrically coupled to at least one first technology device through at least one through-via,
at least one HQ-IPD is electrically coupled to at least one second technology device through at least one through-via,
at least one third signal router is electrically coupled to at least one first technology device through at least one through-via,
at least one third signal router is electrically coupled to at least one second technology device through at least one through-via, or
any combination thereof.

12. The stacked circuit of claim 11, wherein the thermal spreader comprises an aluminum nitride (AlN) layer and/or a diamond layer.

13. The stacked circuit of claim 9, further comprising:
one or more bumps on the third tier configured to enable signal exchanges between the stacked circuit and devices external to the stacked circuit.

14. The stacked circuit of claim 13, wherein the third tier comprises a plurality of metallizations such that the plurality of metalizations and at least one bump are vertically aligned over at least one second technology device so as to provide a vertical thermal path from the at least one second technology device.

15. A method of fabricating a stacked circuit, the method comprising:
forming a first tier comprising one or more first technology devices of a first semiconductor type and one or more first interconnects such that at least one first interconnect is electrically coupled to at least one first technology device;

forming a second tier, the second tier comprising one or more second technology devices of a second semiconductor type different from the first semiconductor type and one or more second interconnects, and at least one second interconnect being electrically coupled to at least one second technology device; and hybrid bonding the first tier with the second tier in which
one or more portions of a first insulator exposed at an upper surface of the first tier are bonded to corresponding one or more portions of a second insulator exposed at a lower surface of the second tier, and
the one or more first interconnects exposed at the upper surface of the first tier are bonded to the one or more second interconnects exposed at the lower surface of the second tier such that the one or more first interconnects are electrically coupled to the one or more second interconnects.

16. The method of claim 15, wherein the first technology devices are Si-CMOS devices and the second technology devices are III-V devices.

17. The method of claim 1, wherein forming the first tier comprises:
   forming a first device layer on a first substrate, the first device layer comprising the one or more first technology devices; and
   forming a first interface layer on the first device layer, the first interface layer comprising the one or more first interconnects and the first insulator such that the one or more first interconnects are electrically coupled to the one or more first technology devices, and
   wherein an upper surface of the first interface layer is the upper surface of the first tier such that at least one first technology device is electrically coupled to at least one second technology device through, in order, at least one first interconnect and at least one second interconnect.

18. The method of claim 15, wherein forming the second tier comprises:
   forming an epitaxial layer on a carrier;
   forming a second device layer on the epitaxial layer, the second device layer comprising the one or more second technology devices; and
   forming a second interface layer on the second device layer such that the one or more second interconnects are electrically coupled to the one or more second technology devices.

19. The method of claim 18,
   wherein the carrier comprises a Si carrier wafer and the epitaxial layer comprises an undoped gallium arsenide (GaAs) layer, and
   wherein forming the second tier further comprises forming a buffer layer in between the carrier and the epitaxial layer.

20. The method of claim 19, wherein the buffer layer is formed from germanium (Ge).

21. The method of claim 18, wherein the carrier comprises a gallium arsenide (GaAs) wafer and the epitaxial layer is a GaAs layer that directly contacts the carrier.

22. The method of claim 21, wherein the carrier comprises a plurality of sliced GaAs substrates.

23. The method of claim 18, wherein forming the second device layer also comprises forming one or more second signal routers such that at least one second interconnect is electrically coupled to at least one second technology device through at least one second signal router.

24. The method of claim 23, wherein at least one second signal router is electrically coupled to at least one first technology device through, in order, at least one second interconnect and corresponding at least one first interconnect.

25. The method of claim 15, wherein hybrid bonding the first tier with the second tier comprises:
   orienting the first tier and/or the second tier such that a first interface layer of the first tier and a second interface layer of the second tier are face-to-face (F2F), the first interface layer comprising the one or more first interconnects and the second interface layer comprising the one or more second interconnects; and
   bonding the first tier and the second tier together such that the one or more first interconnects are electrically coupled to the corresponding one or more second interconnects.

26. The method of claim 25, wherein hybrid bonding the first tier with the second tier further comprises:
   heat treating the first interface layer and the second interface layer subsequent to bringing the first interface layer into contact with the second interface layer.

27. The method of claim 15, further comprising:
   forming a third tier on the second tier, the third tier comprising one or more high quality (HQ) integrated passive devices (IPD) and/or one or more third signal routers,
   wherein the one or more HQ-IPDs and/or the one or more third signal routers are formed such that
      at least one HQ-IPD is electrically coupled to at least one first technology device,
      at least one HQ-IPD is electrically coupled to at least one second technology device,
      at least one third signal router is electrically coupled to at least one first technology device,
      at least one third signal router is electrically coupled to at least one second technology device, or
      any combination thereof.

28. The method of claim 27,
   wherein the second tier comprises a second device layer and an epitaxial layer on the second device layer, the second device layer comprising the one or more second technology devices, and an upper surface of the epitaxial layer being an upper surface of the second tier, and
   wherein the method further comprises forming one or more through-vias to extend from the upper surface to a lower surface of the epitaxial layer such that at least one HQ-IPD is electrically coupled to at least one first technology device through at least one through-via,
      at least one HQ-IPD is electrically coupled to at least one second technology device through at least one through-via,
      at least one third signal router is electrically coupled to at least one first technology device through at least one through-via,
      at least one third signal router is electrically coupled to at least one second technology device through at least one through-via, or
      any combination thereof.

29. The method of claim 28, further comprising:
   forming a thermal spreader in between the second tier and the third tier,
   wherein the one or more through-vias are formed to extend from an upper surface of the thermal spreader to the lower surface of the epitaxial layer.

30. The method of claim 27, further comprising:
   forming one or more bumps on the third tier to enable signal exchanges between the stacked circuit and devices external to the stacked circuit,
   wherein the third tier comprises a plurality of metallizations, and
   wherein the third tier and the one or more bumps are formed such that the plurality of metalizations and at least one bump are vertically aligned over at least one second technology device so as to provide a vertical thermal path from the at least one second technology device.

* * * * *